United States Patent
Ogiwara et al.

(10) Patent No.: US 9,311,996 B2
(45) Date of Patent: Apr. 12, 2016

(54) SEMICONDUCTOR STORAGE DEVICE HAVING RESISTANCE-CHANGE STORAGE ELEMENTS

(71) Applicant: KABUSHIKI KAISHA TOSHIBA, Minato-ku (JP)

(72) Inventors: Ryu Ogiwara, Yokohama (JP); Daisaburo Takashima, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/624,995

(22) Filed: Feb. 18, 2015

(65) Prior Publication Data
US 2016/0071585 A1  Mar. 10, 2016

Related U.S. Application Data

(60) Provisional application No. 62/048,645, filed on Sep. 10, 2014, provisional application No. 62/049,072, filed on Sep. 11, 2014.

(51) Int. Cl.
*G11C 11/00* (2006.01)
*G11C 13/00* (2006.01)

(52) U.S. Cl.
CPC ........ *G11C 13/0038* (2013.01); *G11C 13/0004* (2013.01); *G11C 13/0061* (2013.01); *G11C 13/0069* (2013.01)

(58) Field of Classification Search
CPC ........... G11C 13/0038; G11C 13/0061; G11C 13/0004; G11C 13/0069
USPC .......................... 365/148, 163, 171, 173, 158
See application file for complete search history.

(56) References Cited

U.S. PATENT DOCUMENTS

| 7,274,586 | B2 | 9/2007 | Choi et al. | |
| 7,688,614 | B2* | 3/2010 | Morimoto | 365/148 |
| 8,441,848 | B2 | 5/2013 | Thiruvengadam et al. | |
| 8,625,329 | B2 | 1/2014 | Maejima | |
| 2010/0020594 | A1* | 1/2010 | De Sandre et al. | 365/163 |
| 2010/0149867 | A1* | 6/2010 | Tanaka et al. | 365/185.03 |
| 2011/0063904 | A1* | 3/2011 | Chang et al. | 365/163 |

(Continued)

FOREIGN PATENT DOCUMENTS

| JP | 2003-298013 A | 10/2003 |
| JP | 2005-251383 A | 9/2005 |

(Continued)

OTHER PUBLICATIONS

Junji Tominaga, et al., "Electrical-field induced giant magnetoresistivity in (non-magnetic) phase change films", Applied Physics Letters, vol. 99, No. 152105, 2011, 4 Pages.

(Continued)

*Primary Examiner* — Richard Elms
*Assistant Examiner* — Sultana Begum
(74) *Attorney, Agent, or Firm* — Oblon, McClelland, Maier & Neustadt, L.L.P.

(57) ABSTRACT

A semiconductor storage device according to an embodiment includes a plurality of resistance-change storage elements. A plurality of bit lines are connected to the storage elements, respectively. A voltage control circuit controls a decreasing rate of an absolute value of a voltage of a selected bit line among the bit lines when data is written to one of the storage elements.

19 Claims, 20 Drawing Sheets

(56) References Cited

U.S. PATENT DOCUMENTS

| | | | |
|---|---|---|---|
| 2012/0147655 A1* | 6/2012 | Lee | G11C 8/14 365/148 |
| 2013/0028010 A1* | 1/2013 | Li et al. | 365/158 |
| 2014/0063925 A1* | 3/2014 | Friedman et al. | 365/163 |

FOREIGN PATENT DOCUMENTS

| JP | 2012-027997 A | 2/2012 |
|---|---|---|
| JP | 2012-256410 A | 12/2012 |

OTHER PUBLICATIONS

Youngdon Choi, et al., "A 20nm 1.8V 8Gb PRAM with 40MB/s Program Bandwidth", ISSCC 2012, IEEE International Solid-State Circuits Conference, Feb. 20, 2012, pp. 46-48.

J. Tominaga, et al., "The first Principle Computer Simulation and Real Device Characteristics of Superlattice Phase-Change Memory", IEEE, IEDM 2010, pp. 22.3.1-22.3.4.

Toru Egami, et al., "Investigation of multi-level-cell and SET operations on super-lattice phase change memories", Japanese Journal of Applied Physics, vol. 53, 04ED02, 2014, 9 Pages.

* cited by examiner

US 9,311,996 B2

SEMICONDUCTOR STORAGE DEVICE HAVING RESISTANCE-CHANGE STORAGE ELEMENTS

CROSS REFERENCE TO RELATED APPLICATIONS

This application is based upon and claims the benefit of priority from the prior U.S. Provisional Patent Applications No. 62/048,645, filed on Sep. 10, 2014 and No. 62/049,072, filed on Sep. 11, 2014, the entire contents of which are incorporated herein by reference.

FIELD

The embodiments of the present invention relate to a semiconductor storage device.

BACKGROUND

Semiconductor storage devices such as a NAND flash memory have been downscaled to increase storage capacity. Development of memories using new materials is progressing to achieve further downscaling. Novel memories such as a resistance random access memory (ReRAM), a phase-change RAM (PRAM), a phase-change memory (PCM), an interfacial PCM (iPCM), a ferroelectric NAND-type memory (FeNAND), and a magnetic random access memory (MRAM) are developed.

Among these novel memories, the PCM and the iPCM are brought to a low resistance state (a set state) or a high resistance state (a reset state) according to phase transition of a phase-change film of the relevant memory cell. This enables the PCM and the iPCM to store therein logical data.

In the PCM, an operation called "slow cooling" of slowly sinking a voltage applied to the memory cell is required to rewrite a Reset state with a Set state. This is because it is considered that, if a voltage applied to the memory cell is rapidly sunk, it is possible that the memory cell is not changed from the Reset state to the Set state or returns to the Reset state. It is also considered that the slow cooling operation may be required in the iPCM not only when the Reset state is to be rewritten with the Set state but also when the Set state is to be written with the Reset state.

Therefore, the PCM and the iPCM require a configuration that enables to adjust a rate at which a voltage of a bit line is sunk.

DETAILED DESCRIPTION

Embodiments will now be explained with reference to the accompanying drawings. The present invention is not limited to the embodiments.

A semiconductor storage device according to an embodiment includes a plurality of resistance-change storage elements. A plurality of bit lines are connected to the storage elements, respectively. A voltage control circuit controls a decreasing rate of an absolute value of a voltage of a selected bit line among the bit lines when data is written to one of the storage elements.

The following embodiments are applicable to any of current-detection memories such as a ReRAM, a PRAM, a PCM, an iPCM, a FeNAND, and an MRAM.

First Embodiment

Figure 1:
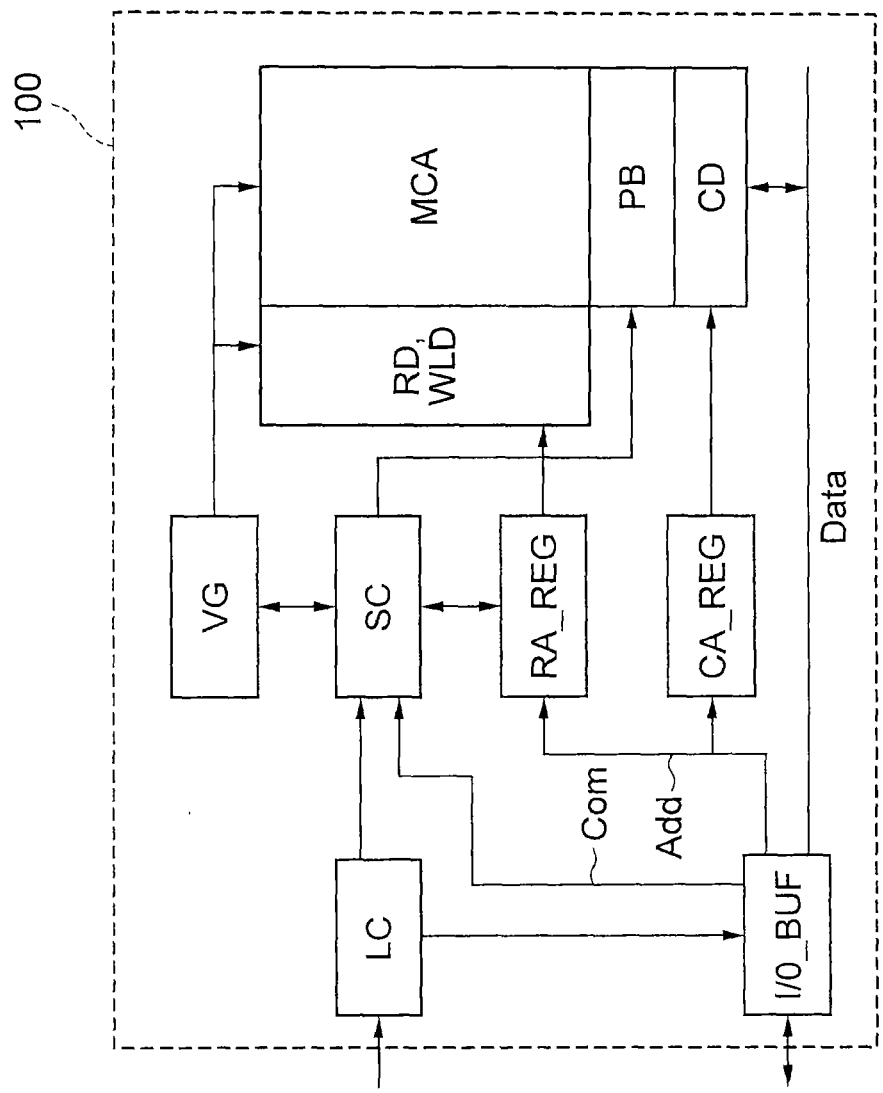
FIG. 1 is a block diagram showing an example of a configuration of a memory 100 according to a first embodiment.

FIG. 1 is a block diagram showing an example of a configuration of a memory 100 according to a first embodiment. The memory 100 includes a memory cell array MCA, a page buffer PB, a column decoder CD, a word line driver WLD, a row decoder RD, an internal-voltage generation circuit VG, a sequence controller SC, a logic controller LC, a row address register RA_REG, a column address register CA_REG, and an input/output (I/O) buffer I/O_BUF. The internal-voltage generation circuit VG includes a step-up circuit that generates a step-up potential higher than that of an external power supply VDD with a charge pump circuit, a source-follower step-down transistor, a circuit that generates an internal step-down potential from that of the external power supply VDD with a PMOS (P-type Metal-Oxide-Semiconductor) feedback circuit, a BGR (Band-Gap-Reference) circuit serving as a reference-potential generation circuit that generates a constant potential regardless of temperatures and power supply voltages, a power-on detection circuit that detects rising of the external power supply potential to a value equal to or larger than a certain value, and the like (not shown). In FIG. 1, arrows indicating supply of the step-up potential to the memory cell array MCA, the row decoder RD, and the word line driver WLD are clearly shown. The step-down potential is supplied to the page buffer PB, the column decoder CD, the sequence controller SC, the row address register RA_REG, and the column address register CA_REG.

The memory cell array MCA includes a plurality of memory cells MC arranged two-dimensionally in a matrix. The row decoder RD and the word line driver WLD selectively step up or drive one of word lines of the memory cell array MCA.

The column decoder CD and the page buffer PB read data of a memory cell MC via a selected bit line or bit line pair and temporarily store therein the read data. The column decoder CD and the page buffer PB temporarily store therein write data and write the write data to a memory cell MC via a selected bit line or bit line pair. The page buffer PB includes a sense amplifier circuit and a data retention circuit and performs read and write of data in units of pages of the memory cell array MCA. The column decoder CD transfers the read data stored in the page buffer PB to the I/O buffer I/O_BUF with respect to each column. The column decoder CD transfers the write data transferred from the I/O buffer I/O_BUF to the page buffer PB with respect to each column.

The row address register RA_REG receives a row address signal via the I/O buffer I/O_BUF and retains the row address signal therein. The column address register CA_REG receives a column address signal via the I/O buffer I/O_BUF and retains the column address signal therein. The row address register RA_REG and the column address register CA_REG transfer the row address signal and the column address signal (hereinafter, also "address signal Add") to the row decoder RD and the column decoder CD, respectively.

Based on a control signal (hereinafter, also "command Com") such as a chip enable signal, a command enable signal, an address-latch enable signal, a write enable signal, or a read enable signal, the logic controller LC controls input of the command Com or the address signal Add and also controls input/output of data Data (the read data or the write data). A read operation or a write operation is performed according to the command Com. Upon receipt of the command Com, the sequence controller SC performs a sequence control on read, write, or erase.

The internal-voltage generation circuit VG is controlled by the sequence controller SC and generates or supplies predetermined voltages required for various operations.

The I/O buffer I/O_BUF outputs the read data from the column decoder CD to outside or transfers the write data from outside to the column decoder CD. The I/O buffer I/O_BUF receives the command Com and the address signal Add.

Figure 2:
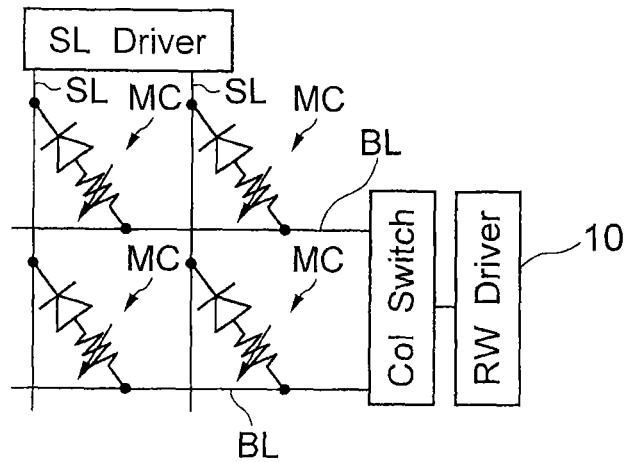
FIG. 2 shows an example of diode memory cells of the iPCM.

FIG. 2 shows an example of diode memory cells of the iPCM. Each of memory cells MC includes a memory element and a diode connected in series between one of bit lines BL and one of source lines SL. The diodes are connected to allow a current to flow from the bit lines BL to the source lines SL, respectively. The source lines SL are connected to a source line driver and the bit lines BL are connected to a read/write driver 10 via a column switch. The source line driver can selectively drive one of the source lines SL. The column switch can selectively connect one of the bit lines BL to the read/write driver 10.

For example, the read/write driver 10 sets a potential of a bit line BL connected to a memory cell MC selected at the time of read or write, for example, at 3 volts and the source line driver sets a potential of a source line SL connected to the selected memory cell MC, for example, at 0 volt. A forward bias is thus applied to the diode of the selected memory cell MC, thereby enabling a current from the read/write driver 10 to flow to the selected memory cell MC. At that time, unselected bit lines BL can be set, for example, at 0 volt and unselected source lines SL can be set, for example, at 0 volt. Accordingly, there is no difference in potentials among unselected memory cells MC and thus no current flows in the unselected memory cells MC.

Figure 3:
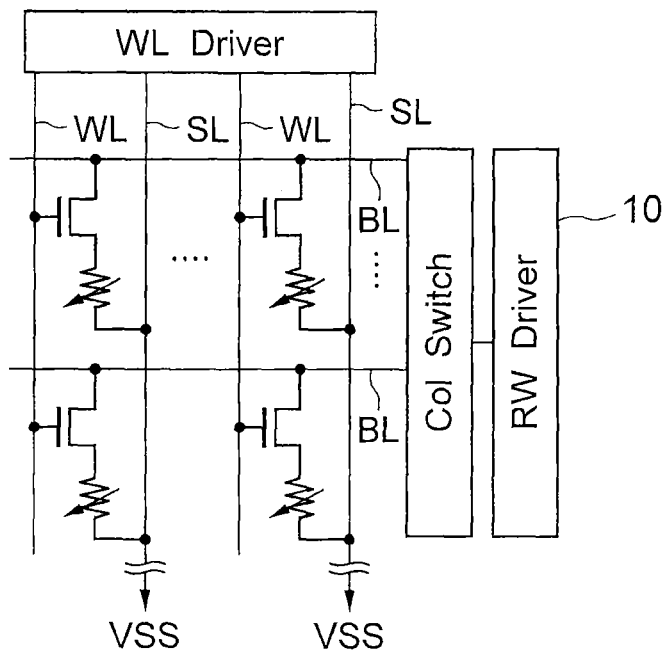
FIG. 3 shows an example of transistor memory cells of the iPCM.

FIG. 3 shows an example of transistor memory cells of the iPCM. Each of memory cells MC includes a memory element and a transistor connected in series between one of bit lines BL and one of source lines SL. A gate of each of the transistors is connected to one of word lines WL. The word lines WL are connected to a word line driver and the bit lines BL are connected to a read/write driver 10 via a column switch. The source lines SL are connected to a low-level voltage source VSS.

With this configuration, the read/write driver 10 enables a current to flow to one of the memory cells MC selected by one of the word lines WL and one of the bit lines BL at the time of read or write.

An operation of the PCM and the iPCM is explained next. The PCM and the iPCM are each brought to a low resistance state (a set state) or a high resistance state (a reset state) according to phase transition of a phase-change film of the relevant memory cell. This enables the PCM and the iPCM to store therein logical data. For example, when the low resistance state (the set state) is data "0" and the high resistance state (the reset state) is data "1", the PCM and the iPCM can store therein "0" and "1".

To rewrite the reset state with the set state, the PCM performs an operation called "slow cooling" of slowly sinking a voltage applied to the memory cell. The slow cooling operation is an operation to slowly sink an absolute value of a voltage of a bit line BL after a voltage for writing data to the bit line BL is applied thereto. Herein, an absolute value of a voltage of a bit line BL is simply called "a voltage of a bit line BL". It is considered that, if a voltage applied to a memory cell is rapidly sunk, there are cases where the memory cell remains as the reset state or returns to the reset state even when it is temporarily changed to the set state. Furthermore, it is considered that the slow cooling operation is required in the iPCM not only when the reset state is to be rewritten with the set state but also when the set state is to be rewritten with the reset state.

Figure 4:
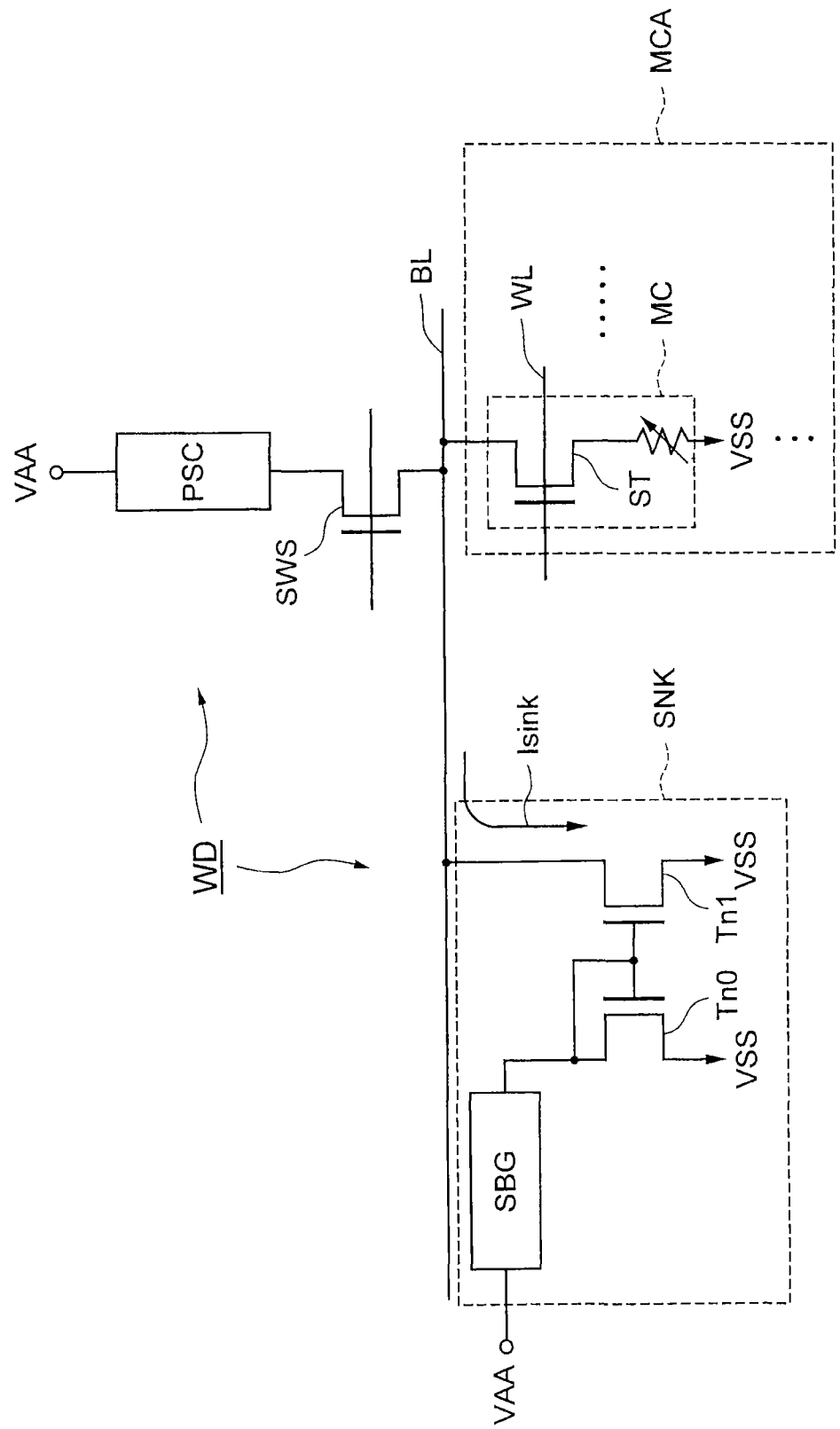
FIG. 4 shows an example of a configuration of a write driver WD that performs a write operation and the memory cell array MCA.

FIG. 4 shows an example of a configuration of a write driver WD that performs a write operation and the memory cell array MCA. The write driver WD is provided in the page buffer PB. The write driver WD includes a sink circuit SNK and a current supply circuit PSC. Although not shown in FIG. 4, a read driver (a sense amplifier) can be provided separately from the write driver WD or can be combined with the write driver WD as in a fourth embodiment.

The memory cell array MCA includes a plurality of memory cells MC. Each of the memory cells MC includes the PCM or the iPCM as a resistance-change storage element and a selection transistor ST. The PCM or the iPCM (hereinafter, also "storage element") and the selection transistor ST are connected in series between one of bit lines BL and a low voltage source VSS. A gate of the selection transistor ST is connected to one of word lines WL.

One end of the current supply circuit PSC is connected to an internal power supply VAA and the other end thereof is connected to the bit lines BL via a switch SWS. The current supply circuit PSC supplies a current to one of the bit lines BL when data is to be written to the corresponding storage element.

The sink circuit SNK serving as a voltage control circuit includes a sink voltage generator SBG and N-type transistors Tn0 and Tn1. The sink voltage generator SBG is provided to generate a sink voltage from a voltage of the internal power supply VAA. The transistors Tn0 and Tn1 constitute a mirror circuit. The transistor Tn0 is connected between the sink voltage generator SBG and the low voltage source VSS. The transistor Tn1 is connected between the bit lines BL and the low voltage source VSS. Gates of the transistors Tn0 and Tn1 are connected in common to the drain of the transistor Tn0. The sink circuit SNK thus allows a sink current Isink based on (obtained by mirroring) a current flowing from the sink voltage generator SBG to the transistor Tn0 to flow from the bit line BL. The sink circuit SNK adjusts the sink current Isink, thereby achieving adjustment of a sink rate of a voltage of one of the bit lines BL in the slow cooling operation at a time when data is to be written to the corresponding storage element. An internal configuration of the current supply circuit PSC can be the same as a current supply path PS shown in FIG. 10A or FIG. 10B.

In a write operation of the reset state or the set state, the current supply circuit PSC supplies a current to one of the bit lines BL to apply a voltage to a selected memory cell MC. After a predetermined voltage is applied to the selected memory cell MC, current supply from the current supply circuit PSC is stopped and then the sink circuit SNK performs the slow cooling operation. In the slow cooling operation, the sink circuit SNK adjusts the sink rate of the voltage of the bit line BL. This enables the memory 100 according to the first embodiment to reliably write the reset state or the set state. During the slow cooling operation, the current supply circuit PSC can adopt one of two methods including a method of stopping the current supply to the bit line BL and a method of continuously supplying the current to adjust the voltage of the bit line BL.

Figure 5A:
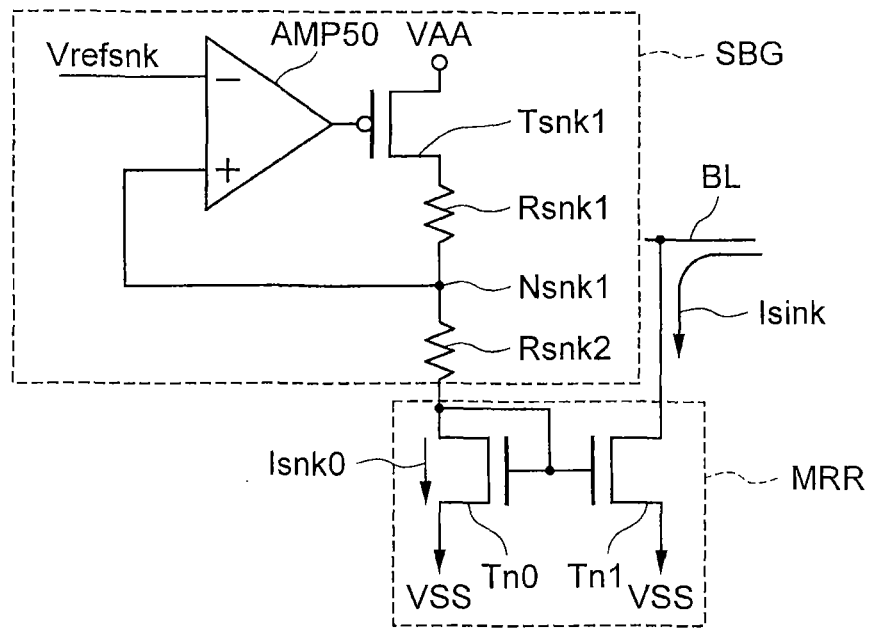
FIG. 5A shows an example of a configuration of a mirror circuit MRR and the sink voltage generator SBG.

FIG. 5A shows an example of a configuration of a mirror circuit MRR and the sink voltage generator SBG. The sink voltage generator SBG includes an operational amplifier AMP50, a transistor Tsnk1, and resistors Rsnk1 and Rsnk2. The transistor Tsnk1, the resistors Rsnk1 and Rsnk2, and the transistor Tn0 are connected in series between the internal power supply VAA and the low voltage source VSS. The operational amplifier AMP50 controls the transistor Tsnk1 to set a node Nsnk1 to be equal to a reference voltage Vrefsnk.

Accordingly, a current Isnk0 flowing to the transistor Tn0 is represented by Expression 1.

$$Isnk0=(Vrefsnk-Vthn0)/r2 \qquad \text{Expression 1}$$

where Vthn0 is a threshold voltage of the transistor Tn0 and r2 is a resistance value of the resistor Rsnk2. In this example, VSS=0 [V].

The mirror circuit MRR allows the sink current Isink determined based on the current Isnk0 to flow to the transistor Tn1.

At that time, the sink current Isink is a current obtained by mirroring the current Isnk0. The mirror rate corresponds to a size (a channel width/a channel length (W/L)) rate between the transistors Tn0 and Tn1. When the sizes of the transistors Tn0 and Tn1 are equal, the sink current Isink is equal to the current Isnk0.

As a method to adjust the sink current Isink, there are a method of adjusting a current and a voltage supplied from the sink voltage generator SBG to the mirror circuit MRR and a method of adjusting the sizes of the transistors Tn0 and Tn1 of the mirror circuit MRR. For this purpose, it is considered to change one of the resistance value r2 of the resistor Rsnk2 shown in FIG. 5A, the reference voltage Vrefsnk, and the size rate (the mirror rate) between the transistors Tn0 and Tn1.

Figure 5B:
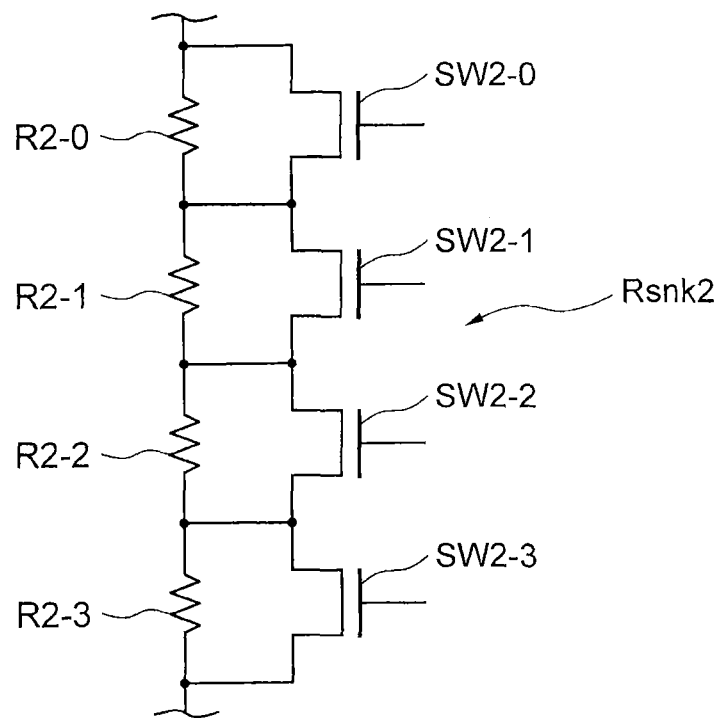
FIG. 5B is a circuit diagram showing an example of a configuration of the resistor Rsnk2.

When the resistance value r2 of the resistor Rsnk2 is to be changed, it suffices to set the resistance value r2 of the resistor Rsnk2 variable as shown in FIG. 5B. FIG. 5B is a circuit diagram showing an example of a configuration of the resistor Rsnk2. The resistor Rsnk2 includes resistors R2-0 to R2-3 and switches SW2-0 to SW2-3. The numbers of resistors and switches are not particularly limited to any number.

The resistors R2-0 to R2-3 are connected in series. The switches SW2-0 to SW2-3 are connected in parallel to the resistors R2-0 to R2-3, respectively. This enables the resistance value r2 of the resistor Rsnk2 to be changed by turning the switches SW2-0 to SW2-3 on or off.

Figure 5C:
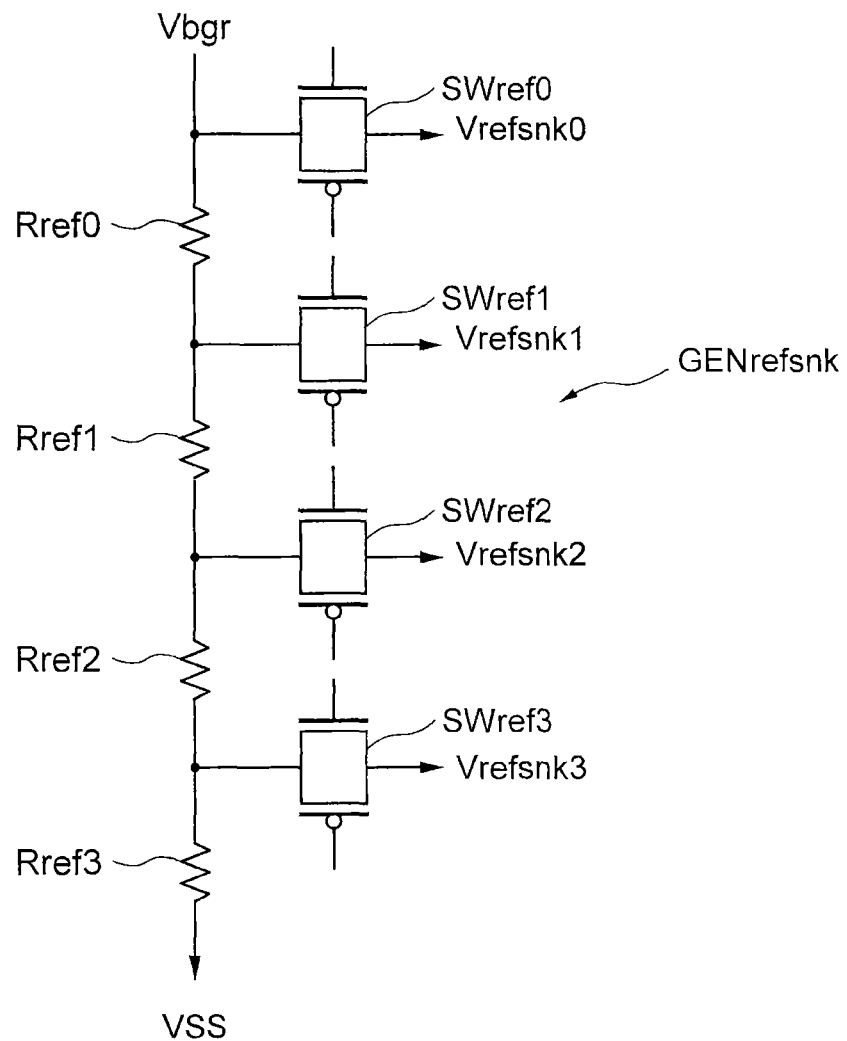
FIG. 5C is a circuit diagram showing an example of a configuration of a Vrefsnk generation unit GENrefsnk.

When the reference voltage Vrefsnk is to be changed, it suffices to divide a bandgap reference voltage Vbgr with resistors Rref0 to Rref3 as shown in FIG. 5C. FIG. 5C is a circuit diagram showing an example of a configuration of a Vrefsnk generation unit GENrefsnk. The Vrefsnk generation unit GENrefsnk includes the resistors Rref0 to Rref3 and switches SWref0 to SWref3. The numbers of resistors and switches are not particularly limited to any number.

The resistors Rref0 to Rref3 are connected in series between the bandgap reference voltage Vbgr and the low voltage source VSS. The switches SWref0 to SWref3 are connected between corresponding ones of ends of the resistors Rref0 to Rref3 and an inverting input terminal of the operational amplifier AMP50 shown in FIG. 5A, respectively. The resistors Rref0 to Rref3 thus divide the bandgap reference voltage Vbgr to generate reference voltages Vrefsnk0 to Vrefsnk3. The switches SWref0 to SWref3 supply the reference voltages Vrefsnk0 to Vrefsnk3, respectively, to the operational amplifier AMP50 as the reference voltage Vrefsnk. In this way, by controlling on/off-states of the switches SWref0 to SWref3, the Vrefsnk generation unit GENrefsnk can change the reference voltage Vrefsnk to one of the reference voltages Vrefsnk0 to Vrefsnk3.

When the bandgap reference voltage Vbgr (1.25 volts, for example) is lower than the internal voltage VAA (2.5 volts, for example), the reference voltage Vrefsnk is equal to or lower than the bandgap reference voltage Vbgr. To set the reference voltage Vrefsnk higher than the bandgap reference voltage Vbgr, it suffices to generate the reference voltage Vrefsnk using the internal voltage VAA.

Figure 5D:
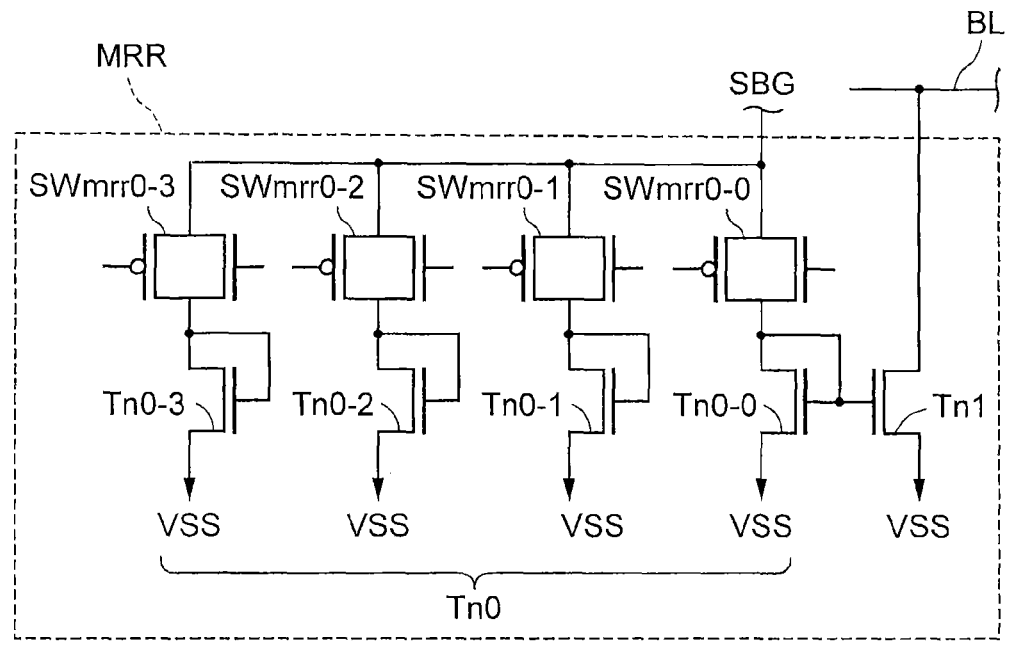
FIGS. 5D and 5E are circuit diagrams showing examples of a configuration of the mirror circuit MRR.
Figure 5E:
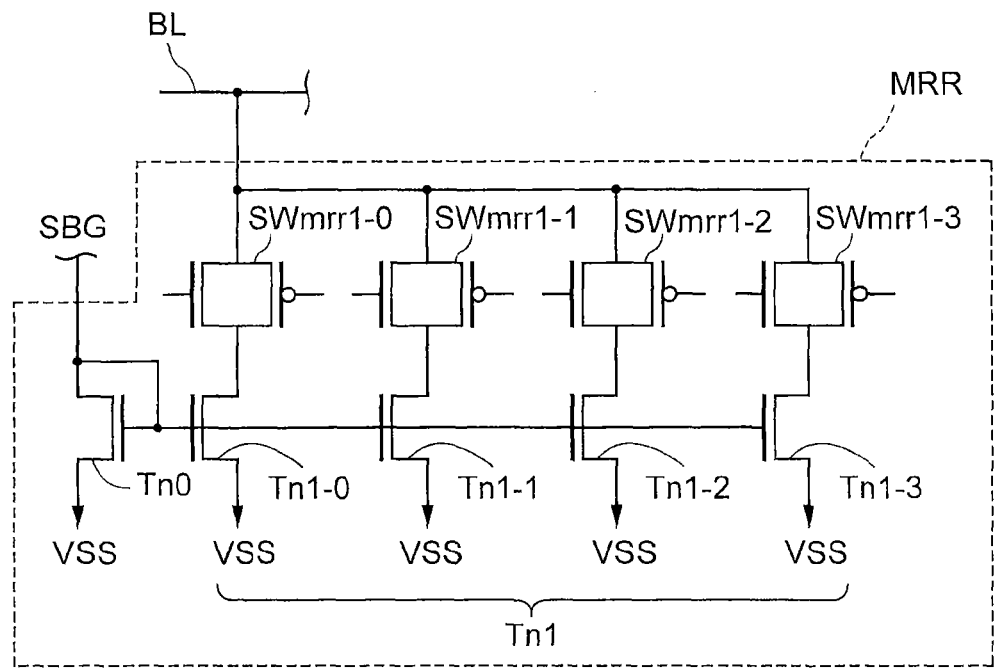

When the size rate (the mirror rate) between the transistors Tn0 and Tn1 is to be changed, it suffices to change the number of transistors connected in parallel to serve as the transistor Tn0 or Tn1 as shown in FIG. 5D or 5E. FIGS. 5D and 5E are circuit diagrams showing examples of a configuration of the mirror circuit MRR. The mirror circuit MRR shown in FIG. 5D includes the transistor Tn1, transistors Tn0-0 to Tn0-3, and switches SWmrr0-0 and SWmrr0-3. The transistors Tn0-0 to Tn0-3 serving as the transistor Tn0 are connected to the sink voltage generator SBG via the switches SWmrr0-0 to SWmrr0-3, respectively. In each of the transistors Tn0-0 to Tn0-3, a gate and a drain are connected with each other, thereby enabling the transistors Tn0-0 to Tn0-3 to function as the transistor Tn0. By turning the switches SWmrr0-0 to SWmrr0-3 on or off, the number of the transistors Tn0-0 to Tn0-3 connected in parallel can be controlled. In this way, the size (W/L) of the transistor Tn0 can be substantially changed.

The mirror circuit MRR shown in FIG. 5E includes the transistor Tn0, transistors Tn1-0 to Tn1-3, and switches SWmrr1-0 to SWmrr1-3. The transistors Tn1-0 to Tn1-3 serving as the transistor Tn1 are connected to the bit lines BL via the switches SWmrr1-0 to SWmrr1-3, respectively. Gates of the transistors Tn1-0 to Tn1-3 are connected in common. By turning the switches SWmrr1-0 to SWmrr1-3 on or off, the number of the transistors Tn1-0 to Tn1-3 connected in parallel can be controlled. In this way, the size (W/L) of the transistor Tn1 can be substantially changed. The size rate (the mirror rate) between the transistors Tn0 and Tn1 can be changed as described above.

A write operation of the PCM or the iPCM according to the first embodiment is explained next. The write operation described below is a write operation requiring the slow cooling operation (write from the reset state to the set state or write from the set state to the reset state).

One of the bit lines BL and one of the word lines WL are first selected to select a desired memory cell MC. Next, the current supply circuit PSC supplies a current to the selected memory cell MC via the selected bit line BL. At that time, a voltage to be applied to the selected memory cell MC is kept at a desired write voltage.

After the current supply circuit PSC supplies the voltage and the current to the selected memory cell MC for a predetermined time, the sink circuit SNK performs the slow cooling operation to slowly decrease the voltage of the bit line BL. At that time, in the first embodiment, the sink circuit SNK decreases the voltage of the bit line BL by discharging the bit line BL. The sink circuit SNK can control the sink rate of the voltage of the bit line BL by controlling the sink current Isink described above. In this way, the selected memory cell MC is slowly cooled and the set state or the reset state can be reliably written thereto.

Second Embodiment

Figure 6:
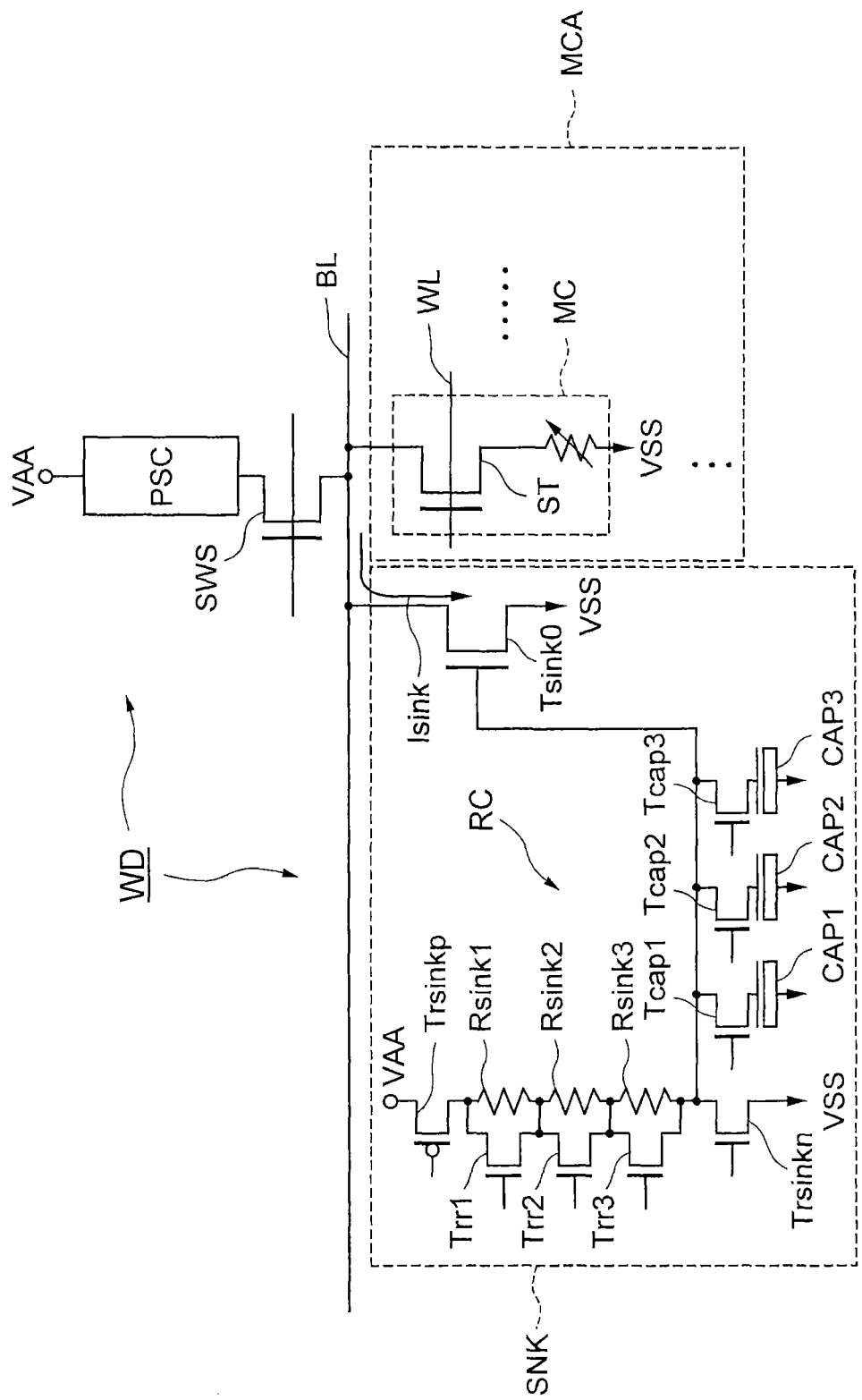
FIG. 6 shows an example of a configuration of the write driver WD and the memory cell array MCA according to a second embodiment.

FIG. 6 shows an example of a configuration of the write driver WD and the memory cell array MCA according to a second embodiment. The second embodiment is different from the first embodiment in the sink circuit SNK. Other configurations of the second embodiment can be identical to the corresponding configurations of the first embodiment.

The sink circuit SNK shown in FIG. 6 includes a sink transistor Tsink0 and an RC delay circuit RC. The sink transistor Tsink0 is connected between the bit lines BL and the low voltage source VSS. A gate of the sink transistor Tsink0 is connected to the RC delay circuit RC.

The RC delay circuit RC is connected to the internal power supply VAA via resistors Rsink1 to Rsink3. Transistors Trr1 to Trr3 are connected in parallel to the resistors Rsink1 to Rsink3, respectively. Therefore, when one of the transistors Trr1 to Trr3 is brought to an on-state, the corresponding one of the resistors Rsink1 to Rsink3 does not function as a resistor and becomes a short-circuit state. That is, one of the resistors Rsink1 to Rsink3 corresponding to one of the transistors Trr1 to Trr3 in the on-state is disabled between the internal power supply VAA and the gate of the sink transistor Tsink0.

On the other hand, when one of the transistors Trr1 to Trr3 is brought to an off-state, the corresponding one of the resistors Rsink1 to Rsink3 functions as a resistor. That is, one of the resistors Rsink1 to Rsink3 corresponding to one of the transistors Trr1 to Trr3 in the off-state is effectively connected between the internal power supply VAA and the gate of the sink transistor Tsink0. Transistors Trsinkp and Trsinkn are kept in an on-state during the sink operation.

Capacitors CAP1 to CAP3 are connected in parallel between the gate of the sink transistor Tsink0 and the low voltage source VSS via transistors Tcap1 to Tcap3, respectively. When the transistors Tcap1 to Tcap3 become an on-state, the corresponding capacitors CAP1 to CAP3 are connected between the gate of the sink transistor Tsink0 and the low voltage source VSS, respectively. That is, ones of the capacitors CAP1 to CAP3 corresponding to ones of the transistors Tcap1 to Tcap3 in the on-state, respectively, are effectively connected between the gate of the sink transistor Tsink0 and the low voltage source VSS On the other hand, when the transistors Tcap1 to Tcap3 become an off-state, the corresponding capacitors CAP1 to CAP3 are disconnected from between the gate of the sink transistor Tsink0 and the low voltage source VSS, respectively. That is, ones of the capacitors CAP1 to CAP3 corresponding to ones of the transistors Tcap1 to Tcap3 in the off-state, respectively, are disabled between the gate of the sink transistor Tsink0 and the low voltage source VSS.

While the three resistors Rsink1 to Rsink3, the three capacitors CAP1 to CAP3, the three transistors Trr1 to Trr3, and the three transistors Tcap1 to Tcap3 are provided, the numbers thereof are not particularly limited to any number.

With this configuration, the RC delay circuit RC can change the resistors and the capacitors connected to the gate of the sink transistor Tsink0. Accordingly, an RC time constant can be changed, thereby adjusting a rising time of a Gate potential of the sink transistor Tsink0. For example, when the rate of the slow cooling operation is to be lowered, it suffices to increase the RC time constant. When the rate of the slow cooling operation is to be enhanced, it suffices to reduce the RC time constant. In this way, the sink circuit SNK shown in FIG. 6 also can adjust the rate of the voltage sink of the bit line BL in the write operation.

Because the write operation of the reset state or the set state is identical to that in the first embodiment, explanations thereof will be omitted here.

Third Embodiment

Figure 7:
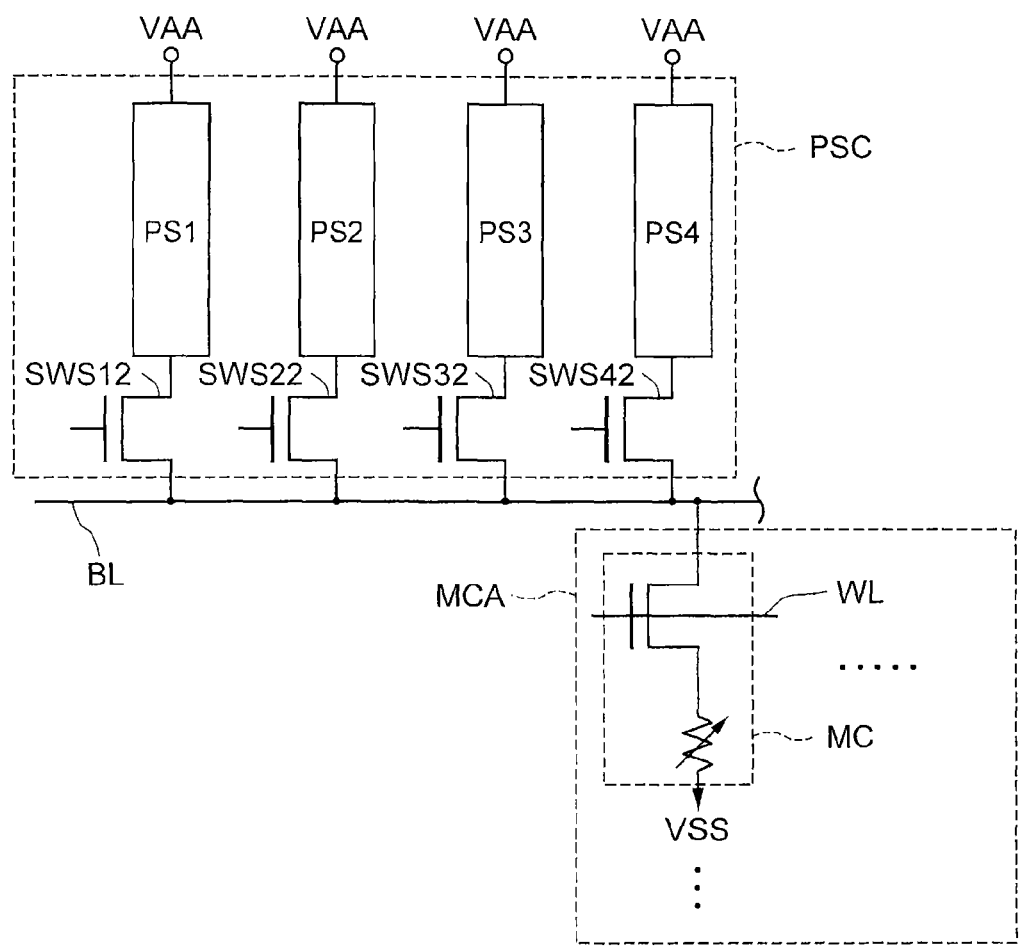
FIG. 7 shows an example of a configuration of the write driver WD and the memory cell array MCA according to a third embodiment.

FIG. 7 shows an example of a configuration of the write driver WD and the memory cell array MCA according to a third embodiment. In the third embodiment, the slow cooling operation is achieved by adjusting a current supply amount of the current supply circuit PSC. That is, the current supply circuit PSC functions as a voltage control circuit according to the third embodiment. Therefore, no sink circuit is provided in the third embodiment.

The current supply circuit PSC includes a plurality of current supply paths PS1 to PS4 and a plurality of current control switches SWS12, SWS22, SWS32, and SWS42. One end of each of the current supply paths PS1 to SP4 is connected to the internal power supply VAA. The other end of each of the current supply paths PS1 to PS4 is connected to the bit lines BL via corresponding one of the current control switches SWS12 to SWS42. This enables the current supply paths PS1 to PS4 to supply a current to one of the bit lines BL via the current control switches SWS12 to SWS42.

Current drive capabilities of the current supply paths PS1 to PS4 can be substantially equal. In this case, the current amount supplied to one of the bit lines BL and one of the memory cells MC is determined by the number of the current supply paths connected to the bit line BL. Therefore, the current amount supplied to the bit line BL and the memory cell MC can be relatively easily controlled.

Meanwhile, the current drive capabilities of the current supply paths PS1 to PS4 can be different from each other. In this case, the current amount supplied to one of the bit lines BL and one of the memory cells MC depends on which current supply path is connected to the bit line BL. A wide variety of the current amount supplied to the bit line BL and the memory cell MC can be set in this case.

The current control switches SWS12 to SWS42 are connected between the corresponding current supply paths PS1 to PS4 and the bit lines BL. The current control switches SWS12 to SWS42 can selectively connect the current supply paths PS1 to PS4 to the bit lines BL.

The configurations of the memory cell array MCA according to the second embodiment can be identical to those of the memory cell array MCA according to the first embodiment.

A write operation of the PCM or the iPCM according to the third embodiment is explained next. Similarly to the first embodiment, one of the bit lines BL and one of the word lines WL are first selected to select a desired memory cell MC. Next, the current supply circuit PSC supplies a current to the selected memory cell MC via the bit line BL. At that time, the current supply switches SWS12 to SWS42 become an on-state, whereby the current supply paths PS1 to PS4 supply a current to the bit line BL and the selected memory cell MC. A voltage applied to the selected memory cell MC is kept at a desired write voltage.

After the current supply circuit PSC supplies the voltage and the current to the selected memory cell MC for a predetermined time, the current supply switches SWS12 to SWS42 become an off-state successively in time series. Accordingly, the current supply paths PS1 to PS4 are disconnected from the bit line BL successively in time series. When the current supply paths PS1 to PS4 are successively disconnected from the bit line BL, the current amount supplied to the bit line BL and the selected memory cell MC gradually reduces. Because the current continuously flows out of the selected memory cell MC to the voltage source VSS, the voltage of the bit line BL slowly decreases according to a difference between the supply current and an outflow current. At that time, the sink rate of the voltage of the bit line BL can be controlled by time intervals or an order at or in which the current supply paths PS1 to PS4 are turned off. This enables the selected memory MC to be slowly cooled and the set state or the reset state can be reliably written.

Figure 18:
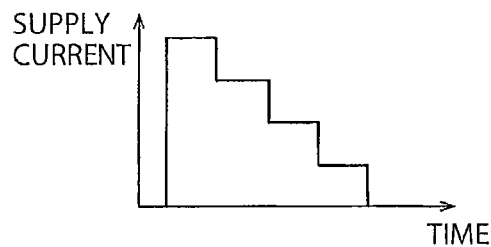
FIG. 18 is a diagram illustrating changing the supply current at equal time intervals.

For example, when the current drive capabilities of the current supply paths PS1 to PS4 are substantially equal, the current amount supplied to the bit line BL and the memory cell MC is determined by the number of current supply paths connected to the bit line BL as described above. Therefore, the order in which the current supply paths PS1 to PS4 are disconnected from the bit line BL can be arbitrarily set. The sink rate of the voltage of the bit line BL is determined by the time intervals at which the current supply paths PS1 to PS4 are disconnected from the bit line BL. Accordingly, the time intervals at which the current supply paths PS1 to PS4 are disconnected from the bit line BL need to be preset. The intervals at which the current supply paths PS1 to PS4 are disconnected from the bit line BL can be different from each other or substantially equal as depicted in FIG. 18.

On the other hand, for example, when the current drive capabilities of the current supply paths PS1 to PS4 are different from each other, the current amount supplied to the bit line BL and the memory cell MC depends on which current supply path is connected to the bit line BL. Therefore, in this case, the order and the time intervals in which and at which the current supply paths PS1 to PS4 are disconnected from the bit line BL need to be set.

Figure 19A:
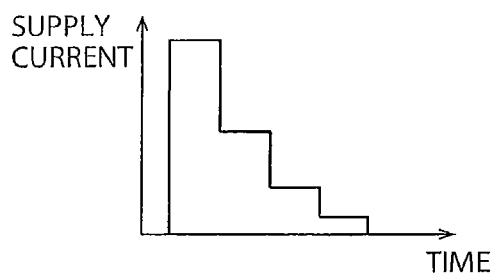
FIGS. 19A and 19B are diagrams illustrating changing the supply current at larger to smaller intervals and small to larger intervals, respectively.
Figure 19B:
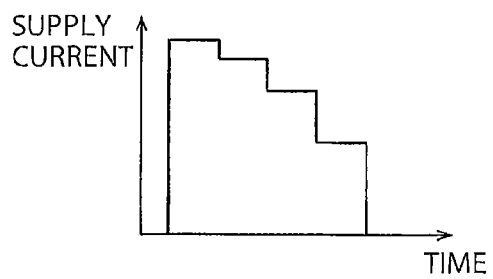
Figure 20A:
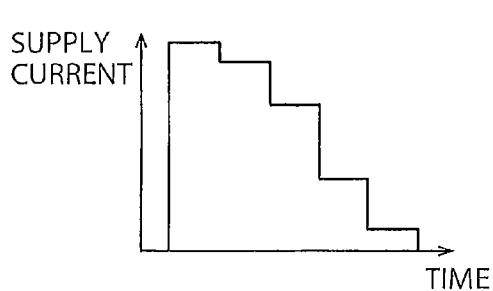
FIG. 20A is a diagram illustrating changing the supply current at smaller to larger then larger to smaller intervals.
Figure 20B:
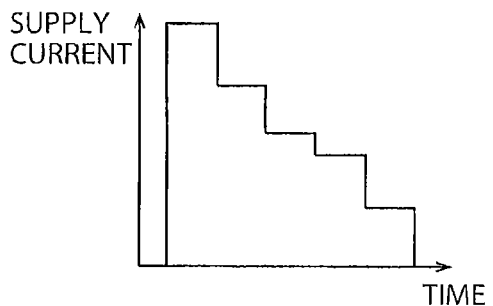
FIG. 20B is a diagram illustrating changing the supply current at larger to smaller then smaller to larger intervals.

In this manner, by adjusting at least one of the order and the time intervals of disconnection of the current supply paths PS1 to PS4, the sink rate of the voltage of the bit line BL can be variously changed. While the sink rate of the voltage of the bit line BL can be uniform, the sink rate can vary during the slow cooling operation. In this way, the sink rate (the slow cooling operation) of the voltage of the bit line BL can be set to be adapted to the PCM or the iPCM. For example, the current supply paths PS1 to PS4 can be disconnected from the bit line BL at substantially equal intervals in time series in the descending order of current drive capabilities as depicted in FIG. 19A. Alternatively, the current supply paths PS1 to PS4 can be disconnected from the bit line BL at substantially equal intervals in time series in the ascending order of current drive capabilities as depicted in FIG. 19B. Furthermore, the current supply paths PS1 to PS4 can be disconnected from the bit line BL in such an order that the current drive capacities are small, large, and small in time series as depicted in FIG. 20A. The current supply paths PS1 to PS4 can be disconnected from the bit line BL in such an order that the current drive capacities are large, small, and large in time series as depicted in FIG. 20A.

Figure 8:
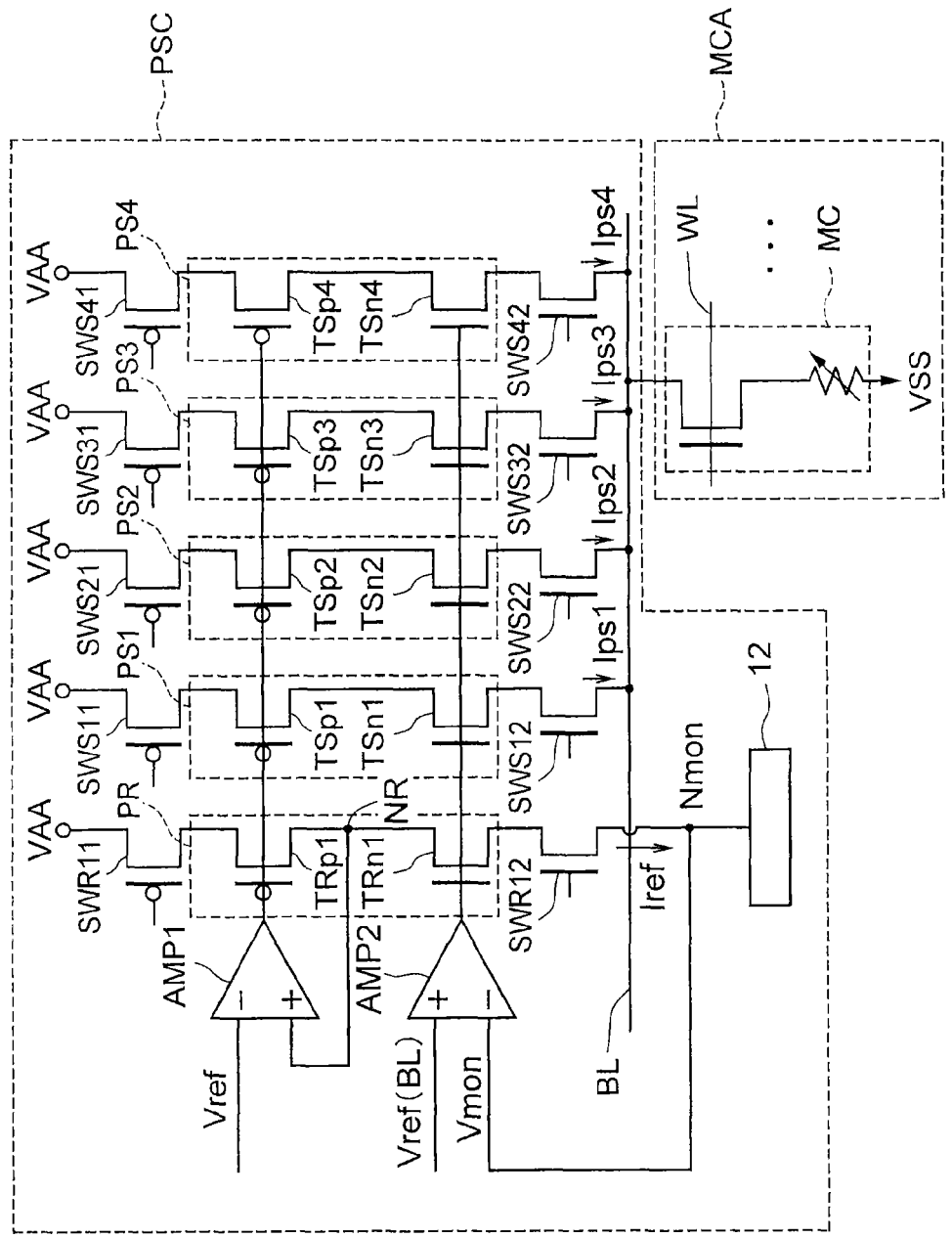
FIG. 8 shows the example of the configuration of the current supply circuit PSC in more detail.

FIG. 8 shows the example of the configuration of the current supply circuit PSC in more detail.

The current supply path PS1 includes a p-type transistor TSp1 and an N-type transistor TSn1 connected in series with each other between the internal power supply VAA and the bit lines BL. A switch SWS11 is located between the internal power supply VAA and the P-type transistor TSp1.

The current supply path PS2 includes a P-type transistor TSp2 and an N-type transistor TSn2 connected in series with each other between the internal power supply VAA and the bit lines BL. A switch SWS21 is located between the internal power supply VAA and the P-type transistor TSp2.

The current supply path PS3 includes a P-type transistor TSp3 and an N-type transistor TSn3 connected in series with each other between the internal power supply VAA and the bit lines BL. A switch SWS31 is located between the internal power supply VAA and the P-type transistor TSp3.

The current supply path PS4 includes a P-type transistor TSp4 and an N-type transistor TSn4 connected in series with each other between the internal power supply VAA and the bit lines BL. A switch SWS41 is located between the internal power supply VAA and the P-type transistor TSp4.

The current supply circuit PSC further includes a reference current path PR, operational amplifiers AMP1 and AMP2, and a current generation circuit 12.

The reference current path PR is connected between the internal power supply VAA and the current generation circuit 12 and has a P-type transistor TRp1 and an N-type transistor TRn1 connected in series with each other. A switch SWR11 is located between the internal power supply VAA and the P-type transistor TRp1. A switch SWR12 is located between the current generation circuit 12 and the N-type transistor TRn1.

The reference current path PR allows a reference current Iref, which is a reference of currents to be supplied by the supply current paths PS1 to PS4 to one of the bit lines BL, to flow. The supply current paths PS1 to PS4 allow supply currents Ips1 to Ips4 based on (obtained by mirroring) the reference current Iref to flow, respectively. Therefore, the supply currents Ips1 to Ips4 are determined by the reference current Iref. The reference current Iref is determined by the current generation circuit 12. The current generation circuit 12 will be explained later.

An inverting input of the operational amplifier AMP1 is connected to Vref. A non-inverting input of the operational amplifier AMP1 is connected to a reference node NR. An output of the operational amplifier AMP1 is connected to gates of the P-type transistors TRp1 and TSp1 to TSp4 in common. Vref is an intermediate potential between VAA and Vref(BL) and determines a voltage of the reference node NR. The reference node NR is connected between the transistors TRp1 and TRn1. The operational amplifier AMP1 controls the transistor TRp1 to set the voltage of the node NR to be equal to Vref. At that time, a gate voltage of the transistor TRp1 is applied also to the gates of the transistors TSp1 to TSp4 in common. In this way, the transistors TSp1 to TSp4 enable mirror currents according to the reference current Iref to flow, respectively.

An inverting input of the operational amplifier AMP2 is connected to a monitor node Nmon between the reference current path PR and the current generation circuit 12. A non-inverting input of the operational amplifier AMP2 is connected to Vref(BL). An output of the operational amplifier AMP2 is connected to gates of the N-type transistors TRn1 and TSn1 to TSn4 in common. Vref(BL) is a voltage of a node Nref(BL) in the current generation circuit 12. The node Nref (BL) will be explained later with reference to FIG. 9. The monitor node Nmon is a node between the reference current path PR and the current generation circuit 12. The operational amplifier AMP2 controls the transistor TRn1 to set the voltage of the node Nmon to be equal to Vref(BL). At that time, a gate voltage of the transistor TRn1 is applied also to the gates of the transistors TSn1 to TSn4 in common. In this way, the transistors TSn1 to TSn4 enable mirror currents according to the reference current Iref to flow, respectively.

Channel widths of the transistors TRp1, TRn1, TSp1 to TSp4, and TSn1 to TSn4 are assumed as WRp1, WRn1, WSp1 to WSp4, and WSn1 to WSn4, respectively, and channel lengths of the transistors TRp1, TRn1, TSp1 to TSp4, and TSn1 to TSn4 are assumed as LRp1, LRn1, LSp1 to LSp4, and LSn1 to LSn4, respectively. In this case, the transistors TRp1, TRn1, TSp1 to TSp4, and TSn1 to TSn4 allow currents proportional to WRp1/LRp1, WRn1/LRn1, WSp1/LWp1 to WSp4/LSp4, and WSn1/LSn1 to WSn4/LSn4 to flow, respectively. That is, a ratio of Iref and Ips1 to Ips4 is determined by a ratio of sizes (WRp1/LRp1, WRn1/LRn1, WSp1/LWp1 to WSp4/LSp4, and WSn1/LSn1 to WSn4/LSn4) of the transistors constituting the reference current path PR and the supply current paths PS1 to PS4. It is preferable that WRp1/LRp1 be equal to WRn1/LRn1. It is preferable that WSp1/LSp1 to WSp4/LSp4 be equal to WSn1/LSn1 to WSn4/LSn4, respectively.

To equalize the current drive capabilities of the current supply paths PS1 to PS4, the sizes of the transistors TSp1 to TSp4 and TSn1 to TSn4 can be equalized. Alternatively, to cause the current drive capabilities of the current supply paths PS1 to PS4 to be different, the sizes of the transistors TSp1 to TSp4 and TSn1 to TSn4 can be different.

Any one of the current supply paths PS1 to PS4 can be selected by the switches SWS11 to SWS42. For example, when the current supply path PS1 is to be selected to allow the supply current Ips1 to flow, it suffices to turn the switches SWS11 and SWS12 on. Similarly, when the current supply path PS2 is to be selected to allow the supply current Ips2 to flow, it suffices to turn the switches SWS21 and SWS22 on. When the current supply path PS3 is to be selected to allow the supply current Ips3 to flow, it suffices to turn the switches SWS31 and SWS32 on. When the current supply path PS4 is to be selected to allow the supply current Ips4 to flow, it suffices to turn the switches SWS41 and SWS42 on. When the current supply circuit PSC supplies a current to a bit line BL, the switches SWR11 and SWR12 of the reference current path PR keep the on-state.

With this configuration, the reference current path PR enables the reference current Iref to flow from the power supply VAA to the current generation circuit 12. Consequently, the current supply paths PS1 to PS4 enable the supply currents Ips1 to Ips4 to flow from the power supply VAA to the bit line BL.

(Current Generation Circuit 12)

Figure 9:
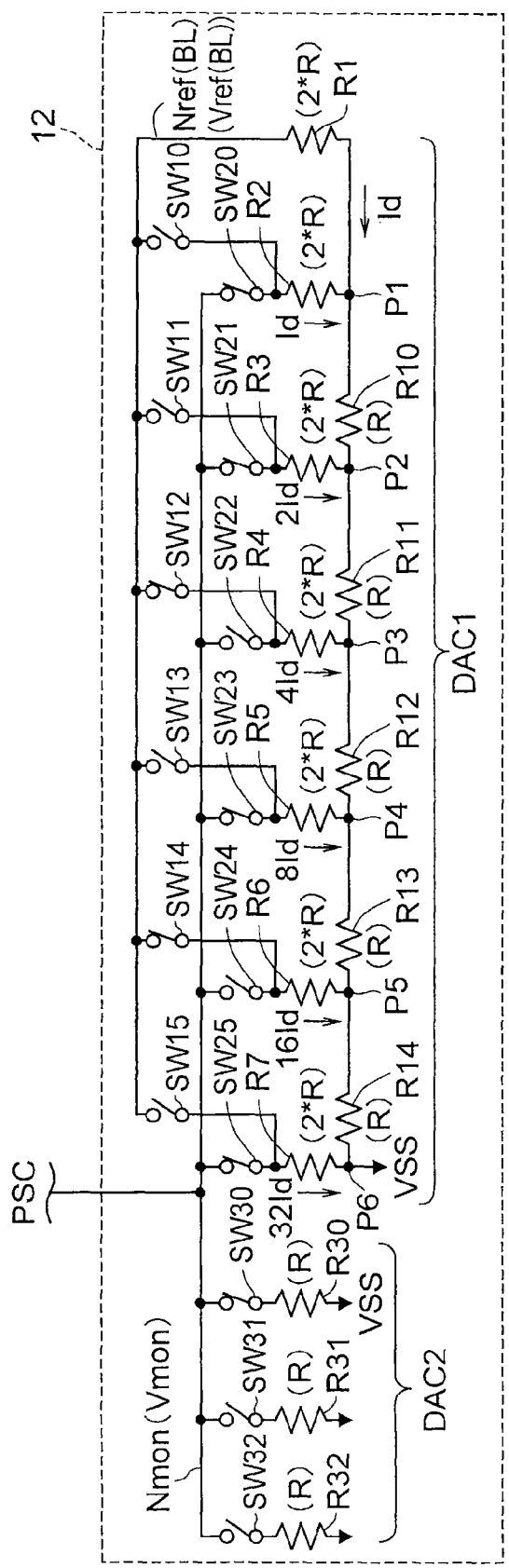
FIG. 9 shows an example of a configuration of the current generation circuit 12.

FIG. 9 shows an example of a configuration of the current generation circuit 12. The current generation circuit 12 includes a Ladder-Binary-type current-addition DA converter DAC1 and a Decode-type DA converter DAC2. The current generation circuit 12 can control a value of the reference current Iref using the converters DAC1 and DAC2.

The converter DAC1 includes resistors R1 to R7 and R10 to R14 and switches SW10 to SW15 and SW20 to SW25. Each of the resistors R10 to R14 has a resistance value of R (R is a positive number), for example. In this case, the resistors R1 to R7 have a resistance value of 2R, for example. One end of the resistor R1 is connected to the node Nref(BL) and the other end thereof is connected to the low voltage source VSS (a ground potential, for example) via the resistors R10 to R14. One end of each of the resistors R2 to R7 is connected to the node Nref(BL) via corresponding one of the switches SW10 to SW15 and is connected to the node Nmon via corresponding one of the switches SW20 to SW25. The other end of the resistor R2 is connected to the low voltage source VSS via the resistors R10 to R14. The other end of the resistor R3 is connected to the low voltage source VSS via the resistors R11 to R14. The other end of the resistor R4 is connected to the low voltage source VSS via the resistors R12 to R14. The other end of the resistor R5 is connected to the low voltage source VSS via the resistors R13 and R14. The other end of the resistor R6 is connected to the low voltage source VSS via the resistor R14. As described above, the converter DAC1 is constituted as the Ladder-Binary-type current-addition DA converter.

The switches SW10 and SW20 operate complementarily with each other. Similarly, respective pairs of the switches SW11 and SW21, the switches SW12 and SW22, the switches SW13 and SW23, the switches SW14 and SW24, and the switches SW15 and SW25 operate complementarily with each other. The switches SW10 to SW25 bring the state to an on or off-state upon receipt of a digital signal. In this way, the converter DAC1 can control the current (the reference current Iref) flowing to the node Nmon.

In the converter DAC1, as the nodes Nref(BL) and Nmon are viewed from a point P1, the resistors R1 and R2 are connected between the point P1 and the nodes Nmon and Nref(BL), respectively. Because the operational amplifier AMP2 controls voltages Vref(BL) and Vmon of the nodes Nref(BL) and Nmon to be equal to each other, currents (Id, for example) flowing in the resistors R1 and R2 are equal to each other. That is, as viewed from the point P1, it is viewed that two resistors with the value of 2×R are connected in parallel to Vmon and Vref(BL), respectively. Accordingly, a current of 2×Id flows at the point P1 toward the voltage source VSS.

As the nodes Nref(BL) and Nmon are viewed from a point P2, it is similarly viewed that two resistors with the value of 2×R are connected in parallel to Vmon and Vref(BL), respectively. Therefore, the current of 2×Id from the point P1 and a current of 2×Id from the resistor R3 converge at the point P2, whereby a current of 4×Id flows toward the voltage source VSS.

As the nodes Nref(BL) and Nmon are viewed from a point P3, it is similarly viewed that two resistors with the value of 2×R are connected in parallel to Vmon and Vref(BL), respectively. Therefore, the current of 4×Id from the point P2 and a current 4×Id from the resistor R4 converge at the point P3, whereby a current of 8×Id flows toward the voltage source VSS.

As the nodes Nref(BL) and Nmon are viewed from a point P4, it is similarly viewed that two resistors with the value of 2×R are connected in parallel to Vmon and Vref(BL), respectively. Therefore, the current of 8×Id from the point P3 and a current of 8×Id from the resistor R5 converge at the point P4, whereby a current of 16×Id flows toward the voltage source VSS This is repeated and therefore a current of 64×Id flows at a point P6 toward the voltage source VSS. When the number of resistor ladders is m (an integer), a current flowing in the converter DAC1 is $2^m$×Id. A combined resistance of the converter DAC1 is R.

A current (Iref1 or Iref2) flowing toward the node Nmon is changed by switching over the binary-type switches SW10 to SW25. For example, when the switches SW20, SW21, SW23, and SW25 are turned on and the switches SW22 and SW24 are turned off, the converter DAC1 allows a sum (Id+2Id+8Id+32Id=43×Id) of currents flowing in the resistors R2, R3, R5, and R7 to flow. By switching over the switches SW10 to SW25, the current caused by the converter DAC1 to flow to the node Nmon can be controlled.

Meanwhile, the converter DAC2 includes resistors R30 to R32 and switches SW30 to SW32. Each of the resistors R30 to R32 has a resistance value of R (R is a positive number), for example. One end of each of the resistors R30 to R32 is connected to the node Nmon via corresponding one of the switches SW30 to SW32 and the other end thereof is connected to the voltage source VSS. As described above, the converter DAC2 is constituted as a decoder-type DA converter.

The resistors R30 to R32 are connected in parallel to the converter DAC1 and thus enable an equal current to that of the converter. DAC1 to flow. For example, when the converter DAC1 allows the current of 64×Id to flow as a whole, the resistors R30 to R32 enable the currents of 64×Id to flow, respectively.

For example, when the switch SW30 is on and the switches SW31 and SW32 are off as shown in FIG. 9, the resistor R30 allows the current of 64×Id to flow from the node Nmon to the voltage source VSS. Therefore, in a state shown in FIG. 9, the converter DAC1 allows the current of 43×Id to flow and the converter DAC2 allows the current of 64×Id to flow. That is, the reference voltage Iref is 107×Id.

Because the converter DAC1 is a binary-type ladder circuit, the converter DAC1 is smaller in the layout area than the decoder-type converter DAC2. Meanwhile, in the decoder-type converter DAC2, cases where the current value decreases due to fluctuations in the resistance values against an intention to increase the current value when the switches are switched over are less likely to occur than in the converter DCA1. For example, in the binary-type ladder circuit, the configuration of resistors greatly changes at the time of a carry in the resistors. More specifically, when the switches are switched over from a configuration with a $(2^{k-1}+ \ldots 2^3+2^2+2^1+2^0)$th resistance value to a $2^k$th configuration with the largest resistance value next to the $(2^{k-1}+ \ldots 2^3+2^2+2^1+2^0)$th configuration, resistors through which the current passes greatly change. In this case, the current value may decrease due to fluctuations in the resistors against an intention to increase the current value. For example, in the binary-type converter DAC1, if the current value decreases due to the fluctuations in the resistors as described above when a current value is switched from that immediately before an MSB (Most Significant Bit) to that of the MSB, a serious problem may occur.

On the other hand, in the decoder-type circuit, it suffices to simply increase or decrease the number of connected resistors and thus the current value never decreases against an intention to increase the current value. That is, the decoder-type converter DAC2 does not have the defect as described above.

Therefore, by providing both of the binary-type converter DAC1 and the decoder-type converter DAC2, both advantages are achieved. That is, the binary-type converter DAC1 supplies a current not corresponding to the MSB and the decoder-type converter DAC2 supplies a current corresponding to the MSB. The current generation circuit 12 thus enables the reference current Iref to flow via the node Nmon.

The reference current Iref and the voltage Vmon are determined by the voltage Vref(BL) and setting of the switches SW10 to SW32.

(Slow Cooling Operation)

The slow cooling operation according to the third embodiment is explained next. In the third embodiment, VAA is about 4.0 volts, Vref(BL) is about 1.2 volts, and Vref is about 3.5 volts.

First, when data (the set state or the reset state, for example) is to be written, the current supply circuit PSC supplies a current to a bit line BL using all of the current supply paths PS1 to PS4 to increase the voltage of the bit line BL. At that time, the switches SWS11 to SWS41 and SWS12 to SWS42 are in the on-state. It is needless to mention that the switches SWR11 and SWR12 of the reference current path PR are also in the on-state at that time.

Next, to perform the slow cooling operation, the current supply paths PS1 to PS4 are disconnected from the bit line BL successively in time series. To disconnect the current supply paths PS1 to PS4 from the bit line BL, it suffices to bring corresponding ones of the switches SWS12 to SWS42 to the off-state, respectively.

For example, when the current drive capabilities of the current supply paths PS1 to PS4 are substantially equal, it suffices to gradually decrease the number of the current supply paths PS1 to PS4 connected to the bit line BL at substantially equal intervals in time series. This gradually decreases the current supplied to the bit line BL and accordingly the slow cooling operation is achieved. The decrease rate of the voltage of the bit line BL can be changed by adjusting the time intervals at which the current supply paths PS1 to PS4 are disconnected from the bit line BL.

On the other hand, when the current drive capabilities of the current supply paths PS1 to PS4 are different from each other, it suffices to preset the order in which the current supply paths PS1 to PS4 are disconnected from the bit line BL and then disconnect the current supply paths PS1 to PS4 in the set order. For example, the current supply paths PS1 to PS4 can be disconnected from the bit line BL at substantially equal intervals in time series in the descending order of current drive capabilities. Alternatively, the current supply paths PS1 to PS4 can be disconnected from the bit line BL at substantially equal intervals in time series in the ascending order of current drive capabilities. In this way, the current supplied to the bit line BL gradually decreases and also an inclination of decrease in the current can be controlled. Furthermore, the current supply paths PS1 to PS4 can be disconnected from the bit line BL in such an order that the current drive capabilities are small, large, and small in time series. Alternatively, the current supply paths. PS1 to PS4 can be disconnected from the bit line BL in such an order that the current drive capabilities are large, small, and large in time series.

The decrease rate of the voltage of the bit line BL can be changed by adjusting the time intervals at which and/or the order in which the current supply paths PS1 to PS4 are disconnected from the bit line BL. For example, the current supply paths PS1 to PS4 can decrease the voltage of the bit line BL at a low rate at an initial time of the slow cooling operation and thereafter decrease the voltage at a high rate. Conversely, the current supply paths PS1 to PS4 can decrease the voltage of the bit line BL at a high rate at an initial time of the slow cooling operation and thereafter decrease the voltage at a low rate.

The current supply circuit PSC according to the third embodiment can adjust the rate of voltage sink of the bit line BL in the slow cooling operation. Accordingly, the memory 100 can achieve reliable write of the reset state or the set state.

In the first and second embodiments, the voltage to be applied to a memory cell MC is decreased while a current from the corresponding bit line BL is flowing to the memory cell MC in the slow cooling operation. Therefore, the PCM and the iPCM according to the first and second embodiments consume a relatively large quantity of current. On the other hand, in the third embodiment, the slow cooling operation is achieved by the current supply circuit PSC decreasing the supply current to the bit line BL instead of by the sink circuit SNK causing a current to flow to decrease the voltage of the bit line BL. Accordingly, a relatively small quantity of current is consumed in the third embodiment. With this configuration, the third embodiment can achieve the slow cooling operation while suppressing the current consumption.

Furthermore, according to the third embodiment, an operation of stabilizing the operation of an operational amplifier while performing the sink operation is not required. With this configuration, the current supply circuit PSC according to the third embodiment has a high stability in the slow cooling operation and facilitates the operation.

Fourth Embodiment

Figure 10A:
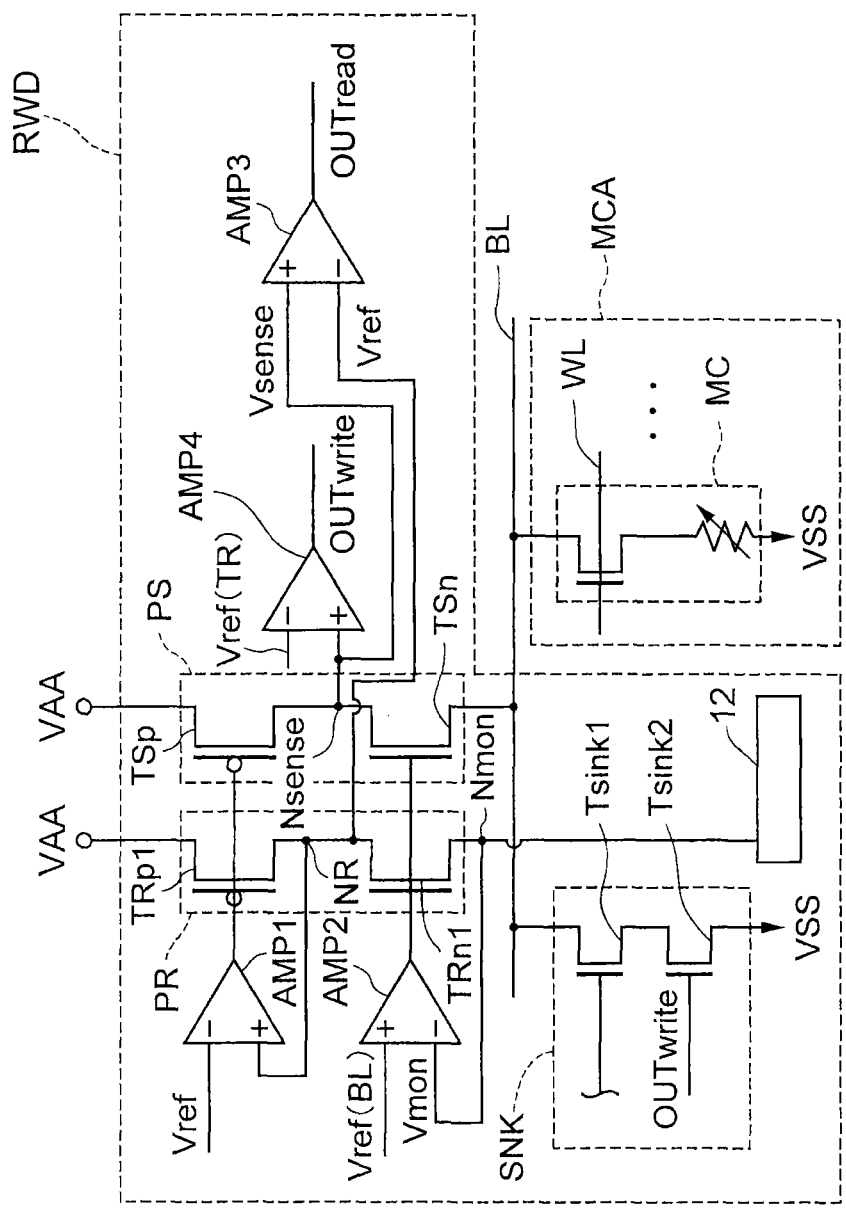
FIGS. 10A and 10B show examples of a configuration of a read/write driver RWD and the memory cell array MCA according to a fourth embodiment.
Figure 10B:
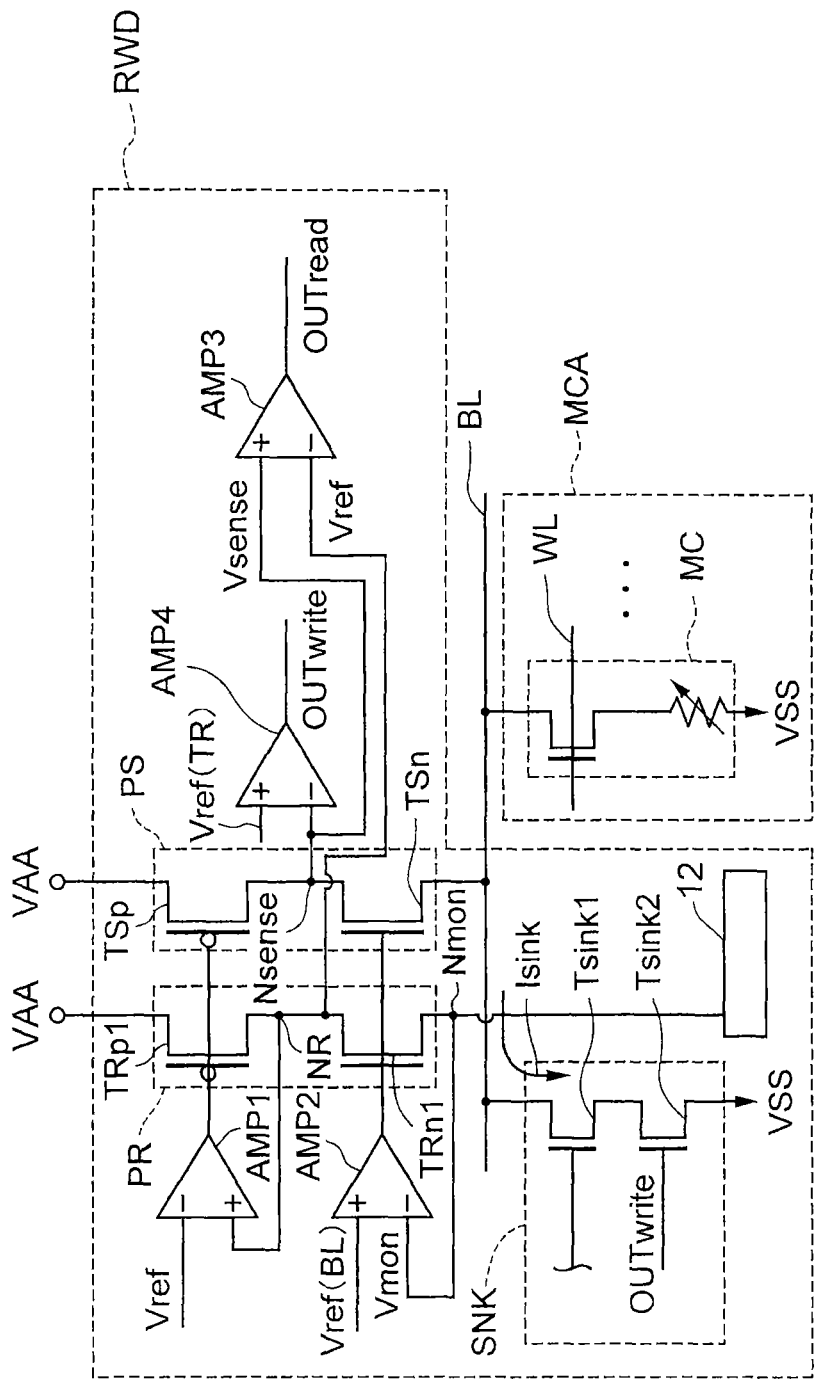

FIGS. 10A and 10B show examples of a configuration of a read/write driver RWD and the memory cell array MCA according to a fourth embodiment. The memory cell array MCA can be identical to the memory cell array MCA according to the first embodiment. The read/write driver RWD shown in FIG. 10A is configured to change the memory cells MC from the reset state to the set state. The read/write driver RWD shown in FIG. 10B is configured to change the memory cells MC from the set state to the reset state.

The read/write driver RWD includes the reference current path PR, a current supply path PS, the operational amplifiers AMP1 and AMP2, operational amplifiers AMP3 and AMP4, the current generation circuit 12, and the sink circuit SNK. The current generation circuit 12, the operational amplifiers AMP1 and AMP2, and the reference current path PR can be identical to those of the third embodiment. While only one current supply path PS is shown for convenience, a plurality of current supply paths can be provided. The switches SWR11, SWR12, SWS11, and SWS12 connected to the reference current path PR and the current supply path PS are not shown. It can be supposed that the switches SWR11, SWR12, SWS11, and SWS12 are in the on-state in the following read and write operations.

In the fourth embodiment, the sink circuit SNK functions as a voltage control circuit. The sink circuit SNK as the voltage control circuit includes an N-type transistor Tsink1 and an N-type transistor Tsink2. The transistor Tsink1 can be controlled by a mirror circuit or an RC delay circuit similarly to the transistor Tn1 shown in FIG. 4 or the transistor Tsink0 shown in FIG. 6. The transistor Tsink2 serving as a stop transistor is controlled according to an output OUTwrite of the operational amplifier AMP4 and is turned off upon completion of the slow cooling operation.

An inverting input of the operational amplifier AMP3 is connected to the node NR. A non-inverting input of the operational amplifier AMP3 is connected to a node Nsense between transistors TSp and TSn of the current supply path PS. A voltage Vsense (hereinafter, also "sense voltage Vsense") of the node Nsense corresponds to a voltage of a bit line BL and greatly changes according to a resistance value (the set state or the reset state) of a memory cell MC. The reference voltage Vref is set to a voltage intermediate between the sense voltage Vsense at a time when the memory cell MC is in the set state and the sense voltage Vsense at a time when the memory cell MC is in the reset state. This enables the operational amplifier AMP3 to detect a data state (the set state or the reset state) of the memory cell MC.

For example, in the data read operation, when a selected memory cell MC is in the set state (the low resistance state), the sense voltage Vsense is lower than the reference voltage Vref. Therefore, the operational amplifier AMP3 outputs logic low as an output OUTread. When the memory cell MC is in the reset state (the high resistance state), the sense voltage Vsense is higher than the reference voltage Vref. Therefore, the operational amplifier AMP3 outputs logic high as the output OUTread. This enables the operational amplifier AMP3 to detect data of the memory cell MC.

Meanwhile, in FIG. 10A, an inverting input of the operational amplifier AMP4 serving as a first control unit is connected to a reference voltage Vref(TR). A non-inverting input of the operational amplifier AMP4 is connected to the node Nsense. An output of the operational amplifier AMP4 is connected to a gate of the transistor Tsink2. The reference voltage Vref(TR) in the slow cooling operation for the data write is set to an intermediate voltage between the sense voltage Vsense before phase transition of the memory cell MC and the sense voltage Vsense after the phase transition of the memory cell MC. This enables the operational amplifier AMP4 to detect whether data has been written to the memory cell MC during the slow cooling operation and to control the transistor Tsink2 based on a result of the detection.

For example, when the set state (the low resistance state) is to be written to the memory cell MC, the current supply path PS supplies a current to the bit line BL to increase the voltage of the bit line BL to the write voltage of the set state. The sink circuit SNK then causes a current to flow from the bit line BL to slowly decrease the voltage of the bit line BL (the slow cooling operation). When the phase of the memory cell MC transitions from the reset state (the high resistance state) to the set state (the low resistance state) in the slow cooling operation, the voltage of the node Nsense rapidly decreases from a high level to a low level. That is, the voltage of the node Nsense decreases from the pre-transition sense voltage Vsense to the post-transition sense voltage Vsense. Therefore, the operational amplifier AMP4 switches the output OUTwrite from logic high to logic low when the memory cell MC transitions in the phase. This enables the operational amplifier AMP4 to detect completion of data write and to bring the transistor Tsink2 of the sink circuit SNK to an off-state. When the transistor Tsink2 is brought to the off-state, a flow of the sink current Isink stops and the sink circuit SNK stops the slow cooling operation.

As the read/write driver RWD that changes the memory cell MC from the set state to the reset state, the operational amplifier AMP4 in which the inverting input terminal and the non-inverting input terminal are reversed as shown in FIG. 10B is conceivable. Other configurations of the read/write driver RWD in FIG. 10B can be identical to the corresponding configurations in the read/write driver RWD shown in FIG. 10A. In this way, the output OUTwrite can be inverted from logic high to logic low to bring the transistor Tsink2 of the sink circuit SNK to the off-state when the memory cell MC transitions in the phase from the set state (the low resistance state) to the reset state (the high resistance state). The operational amplifier AMP4 thus also can detect write of the reset state and bring the transistor Tsink2 of the sink circuit SNK to the off-state.

As described above, according to the fourth embodiment, the operational amplifier AMP3 can detect data of the memory cell MC in the data read operation. Furthermore, in the data write operation, the operational amplifier AMP4 can detect phase transition (completion of data write) of the memory cell MC and stop the slow cooling operation. With this configuration, it is possible to further reduce the current consumption. Furthermore, the fourth embodiment can achieve effects identical to those of the first embodiment or the second embodiment.

First Modification

Figure 11:
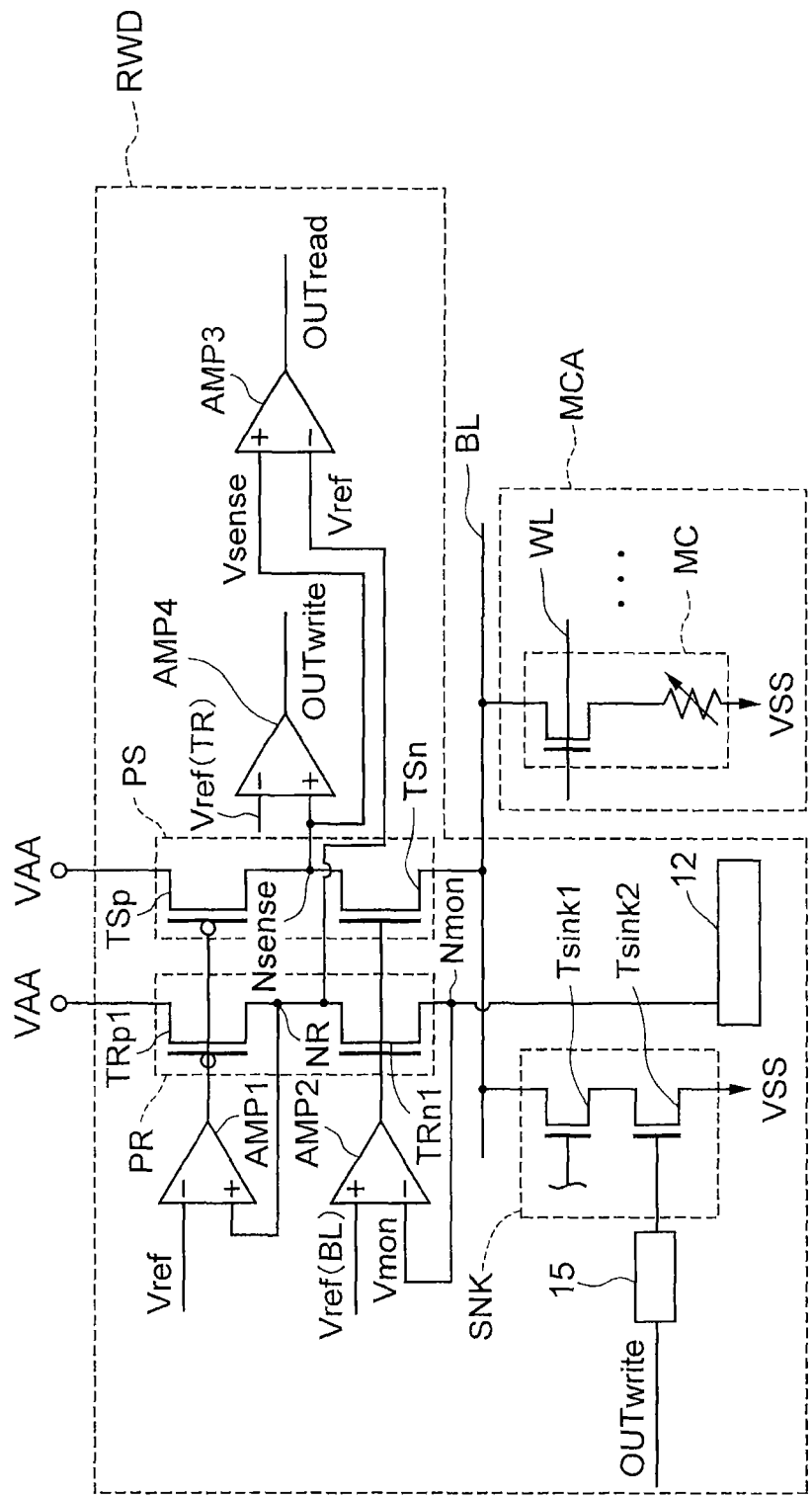
FIG. 11 shows an example of a configuration according to a first modification of the fourth embodiment.

FIG. 11 shows an example of a configuration according to a first modification of the fourth embodiment. The read/write driver RWD according to the first modification further includes a level shifter 15 connected between the operational amplifier AMP4 and the gate of the transistor Tsink2. Other configurations of the read/write driver RWD according to the first modification can be identical to the corresponding configurations in the fourth embodiment.

The level shifter 15 converts (steps up or steps down) the voltage of the output OUTwrite of the operational amplifier AMP4 and then applies the converted voltage to the gate of the transistor Tsink2. With this configuration, in the first modification, a slow cooling operation identical to that in the fourth embodiment can be performed more reliably.

Second Modification

Figure 12A:
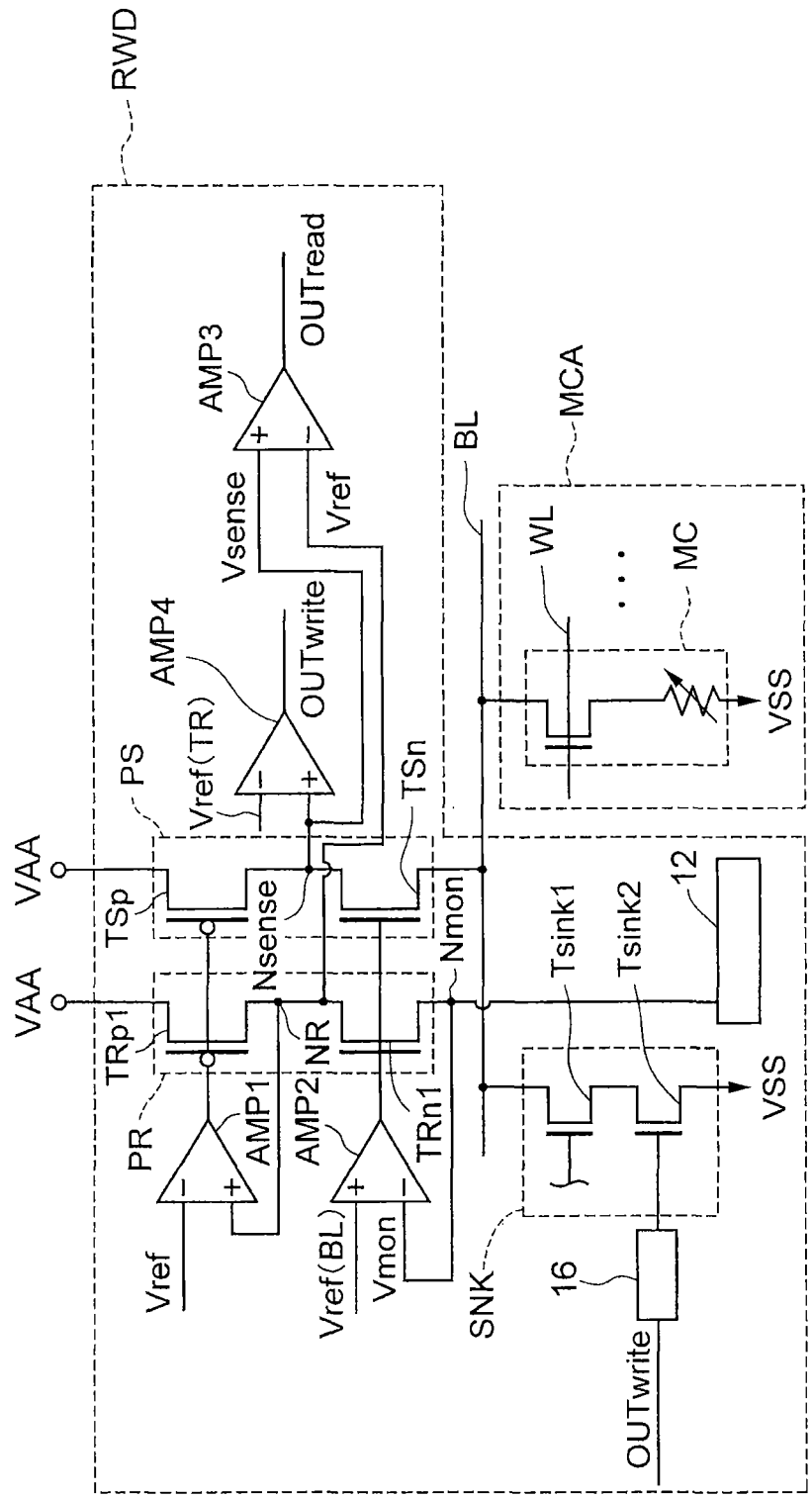
FIG. 12A shows an example of a configuration according to a second modification of the fourth embodiment.

FIG. 12A shows an example of a configuration according to a second modification of the fourth embodiment. The read/write driver RWD according to the second modification further includes a delay circuit 16 connected between the operational amplifier AMP4 and the gate of the transistor Tsink2. Other configurations of the read/write driver RWD according to the second modification can be identical to corresponding ones of the fourth embodiment.

The delay circuit 16 delays the output OUTwrite of the operational amplifier AMP4 for a predetermined time and then applies the delayed output to the gate of the transistor Tsink2. Accordingly, in the second modification, after reliable phase transition of the memory cell MC during the data write operation, the operation of the sink circuit SNK can be stopped. That is, the operation of the sink circuit SNK can be stopped with a certain time allowance from the phase transition of the memory cell MC.

For example, the delay circuit 16 can have an identical configuration to that of the RC delay circuit RC shown in FIG. 6. In this case, it suffices to apply an inversion signal of the output OUTwrite of the operational amplifier AMP4 to gates of the transistors Trsinkp and Trsinkn.

The first modification and the second modification can be combined with each other.

Third Modification

Figure 12B:
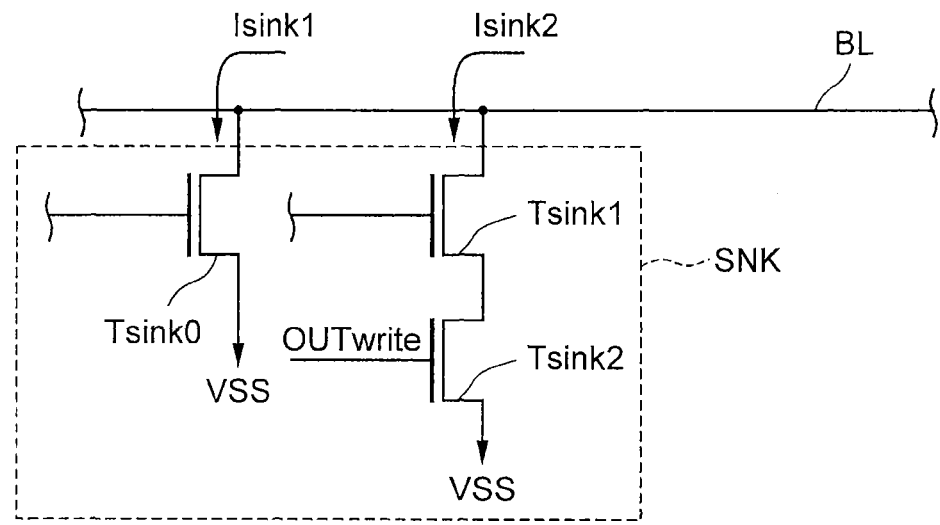
FIG. 12B shows an example of a configuration of the sink circuit SNK according to a third modification.

FIG. 12B shows an example of a configuration of the sink circuit SNK according to a third modification. Other configurations in the third modification can be identical to the corresponding configurations in the fourth embodiment. The sink circuit SNK includes the transistor Tsink0 serving as a first sink transistor, the transistor Tsink1 serving as a second sink transistor, and the transistor Tsink2 serving as a third sink transistor. The connection relation of the transistors Tsink1 and Tsink2 can be identical to that shown in FIG. 10A or FIG. 10B.

The transistor Tsink0 is connected between the bit lines BL and the low voltage source VSS. The transistor Tsink0 has a larger size (W/L) than the transistor Tsink1. Therefore, the transistor Tsink0 enables a larger current than the transistor Tsink1 to flow at the same gate voltage.

Figure 12C:
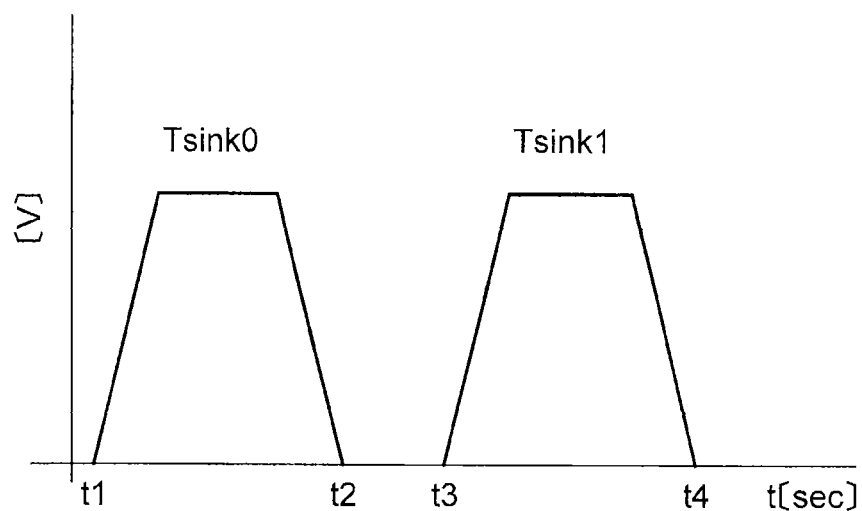
FIG. 12C is a timing chart showing operations of the transistor Tsink1 and Tsink0 in the sink circuit SNK according to the third modification.

FIG. 12C is a timing chart showing operations of the transistor Tsink1 and Tsink0 in the sink circuit SNK according to the third modification. The horizontal axis represents the time and the vertical axis represents the gate voltage of the transistors Tsink1 and Tsink0.

In the third modification, the slow cooling operation is performed twice in the write operation. A sink current Isink1 is caused to flow in the first slow cooling operation (between t1 and t2) and a sink current Isink2 is caused to flow in the second slow cooling operation (between t3 and t4).

First, the current supply path PS (in FIG. 10A or FIG. 10B) increases the voltage of a bit line BL and then the transistor Tsink0 decreases the voltage of the bit line BL between t1 and t2. At that time, because the size of the transistor Tsink0 is relatively large, the sink current Isink1 is relatively high. Therefore, the voltage of the bit line BL relatively rapidly decreases. In the first slow cooling operation, when the memory cell MC transitions in the phase and data is written thereto, the output OUTwrite is inverted from logic high to logic low as described above. Therefore, the transistor Tsink2 becomes the off-state and thus the sink current Isink2 does not flow in the second slow cooling operation. In this way, the current consumption can be suppressed.

If the memory cell MC does not transition in the phase and data is not written thereto in the first slow cooling operation, the voltage of the bit line BL is increased again and then the transistors Tsink1 and Tsink2 decrease the voltage of the bit line BL between t3 and t4. At that time, the size of the transistor Tsink1 is smaller than that of the transistor Tsink0. Therefore, the sink current Isink2 becomes smaller than the sink current Isink1 and the voltage decrease in the bit line BL is slowed. Accordingly, the second slow cooling operation is slower than the first slow cooling operation and data is more easily written to the memory cell MC. When the memory cell MC transitions in the phase and data is written thereto in the second slow cooling operation, the output OUTwrite is inverted from logic high to logic low as described above. Therefore, when the memory cell MC transitions in the phase, the transistor Tsink2 becomes the off-state and the second cooling operation is stopped. In this way, the current consumption can be suppressed.

The sink circuit SNK according to the third modification can perform a plurality of slow cooling operations while changing the rate of slow cooling and can reliably write data to the memory cells MC. Additionally, the sink circuit SNK according to the third modification can detect phase transition (completion of data write) of the memory cell MC and stop the slow cooling operation as in the fourth embodiment. Accordingly, the third modification can achieve effects identical to those of the fourth embodiment.

When the third modification is applied to FIGS. 10A and 10B, the third modification can be adapted to both of change from the reset state to the set state and change from the set state to the reset state. Furthermore, the third modification can be combined with the first modification and/or the second modification.

Fourth Modification

In the write operation according to the third modification, there is an assumption that data is more easily written to the memory cell MC by slowly performing the slow cooling operation. However, there are cases where data is more easily written to the memory cell MC by performing the slow cooling operation at a high rate. For example, phase transition from the set state to the reset state may occur by steeply decreasing the voltage of the bit line BL.

In such a case, it suffices to set the size (W/L) of the transistor Tsink0 shown in FIG. 12B to be smaller than the size (W/L) of the transistor Tsink1. Other configurations and operations of a fourth modification can be identical to the corresponding configurations and operations of the third modification. In this way, the transistor Tsink0 smaller in the size allows the sink current Isink1 to flow in the first slow cooling operation (between t1 and t2) and the transistor Tsink1 larger in the size allows the sink current Isink2 to flow in the second slow cooling operation (between t3 and t4). The voltage of the bit line BL thus decreases relatively slowly in the first slow cooling operation and the voltage of the bit line BL decreases relatively rapidly in the second cooling operation. As a result, change from the set state to the reset state also can be reliably achieved.

Fifth Embodiment

Figure 13:
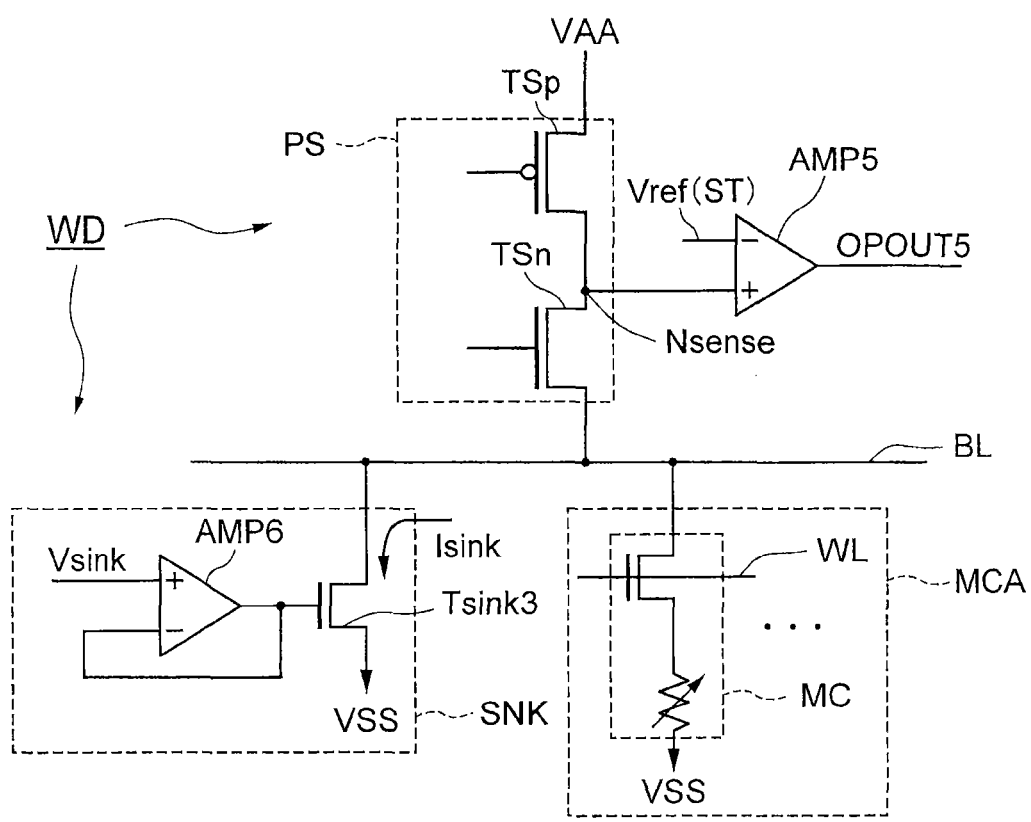
FIG. 13 shows an example of a configuration of a write driver WD and the memory cell array MCA according to a fifth embodiment.

FIG. 13 shows an example of a configuration of a write driver WD and the memory cell array MCA according to a fifth embodiment. In the fifth embodiment, the write driver WD monitors the write degree of existing data having been written to the memory cell MC and adjusts the slow cooling operation at the time of write of new data according to the write degree. That is, in the write operation, the write driver WD according to the fifth embodiment performs the slow cooling operation appropriate for a state of the phase-change film before occurrence of phase transition of the memory cell MC.

Although not shown in FIG. 13, a read driver according to the fifth embodiment can be provided separately from the write driver WD or combined with the write driver WD. The memory cell array MCA according to the fifth embodiment can be identical to the memory cell array MCA according to the first embodiment.

Figure 14:
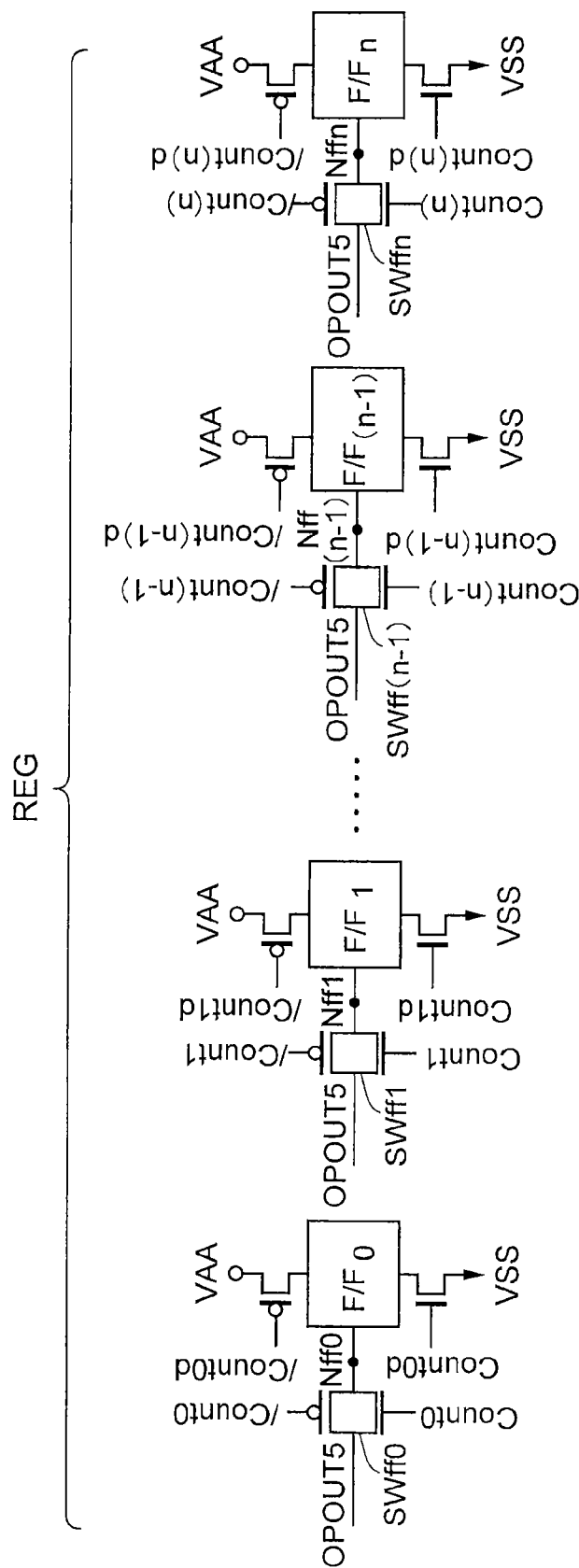
FIG. 14 shows an example of a configuration of a register unit REG.
Figure 15:
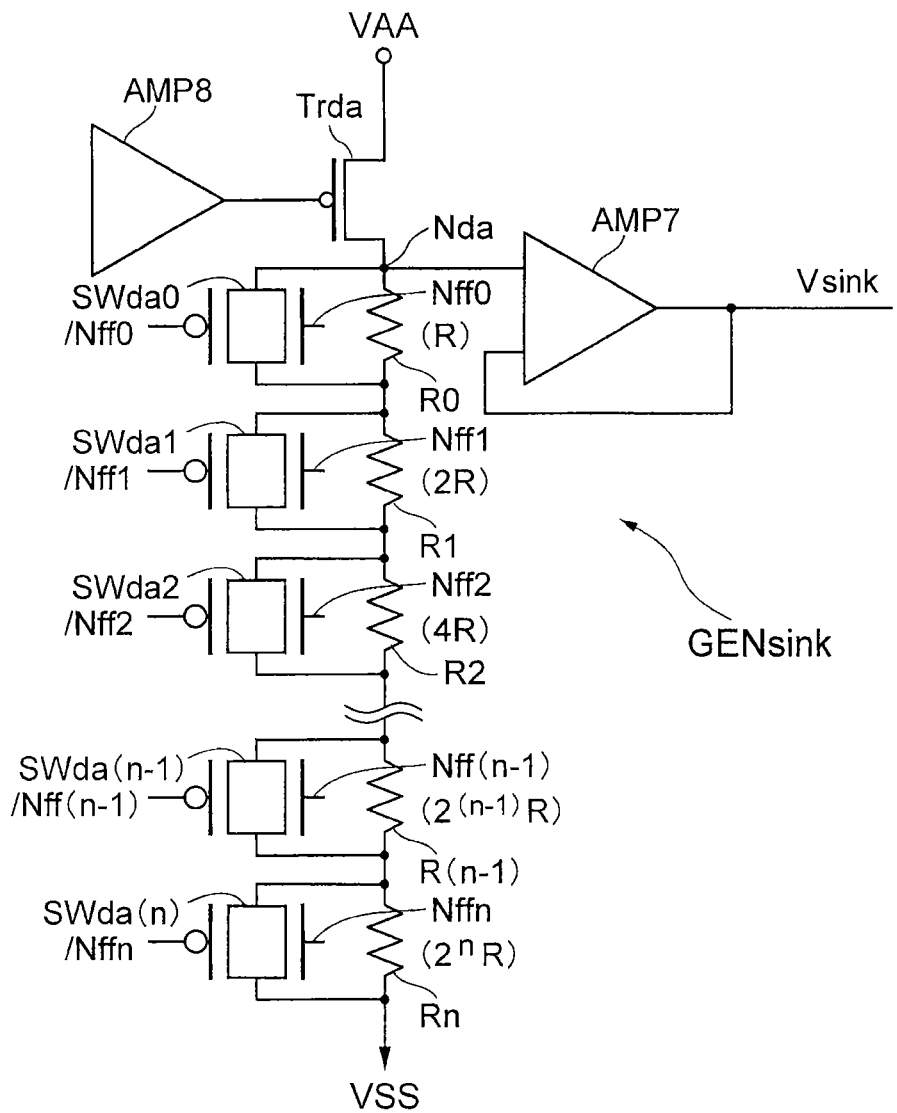
FIG. 15 shows an example of a configuration of a Vsink generator GENsink.

The write driver WD includes the current supply path PS, an operational amplifier AMP5, the sink circuit SNK, a register unit REG (FIG. 14), and a DA converter DAC (FIG. 15). The current supply path PS has an identical configuration to that of the current supply path PS in FIG. 10A.

The operational amplifier AMP5 serving as a second control unit has an inverting input terminal to which a step reference voltage Vref(ST) is input and a non-inverting input terminal connected to the node Nsense. An output OPOUT5 of the operational amplifier AMP5 is connected to the register unit REG shown in FIG. 14. The step reference voltage Vref (ST) is a reference voltage that increases or decreases in a stepwise manner to detect a voltage at the node Nsense. The operational amplifier AMP5 inverts the logic of the output OPOUT5 when the step reference voltage Vref(ST) exceeds or falls below the voltage of the node Nsense.

The sink circuit SNK includes a transistor Tsink3 and an operational amplifier AMP6. The transistor Tsink3 is provided between the bit lines BL and the low voltage source VSS. The operational amplifier AMP6 has a non-inverting terminal to which a voltage Vsink is input. An inverting terminal and an output terminal of the operational amplifier AMP6 are connected to a gate of the transistor Tsink3. Accordingly, the operational amplifier AMP6 keeps a gate voltage of the transistor Tsink3 at the voltage Vsink. That is, the voltage Vsink determines the sink current Isink and can control the slow cooling operation.

FIG. 14 shows an example of a configuration of the register unit REG. The register unit REG receives the output OPOUT5 of the operational amplifier AMP5 and stores therein the output OPOUT5.

The resistor unit REG includes latch circuits F/F0 to F/Fn (n is a positive integer) and selection switches SWff0 to SWffn. The latch circuits F/F0 to F/Fn are connected to the output OPOUT5 of the operational amplifier AMP5 via the selection switches SWff0 to SWffn, respectively.

The selection switches SWff0 to SWffn are controlled by counter signals Count0 to Countn and inversion signals /Count0 to /Countn thereof, respectively. The latch circuits F/F0 to F/Fn are controlled by counter signals Count0d to Countnd and inversion signals /Count0d to /Countnd thereof, respectively.

Data latched by the latch circuits F/F0 to F/Fn is output from nodes Nff0 to Nffn, respectively.

For example, when the latch circuit F/F0 is to be selected, the counter signal Count0 is pulse-driven from logic high to logic low and the counter signal Count0d is set to logic high. The inversion signals /Count0 and /Count0d have inverse the logic of the counter signals Count0 and Count0d, respectively. This brings the selection switch SWff0 to a conduction state and the output OPOUT5 of the operation amplifier AMP5 is connected to the latch circuit F/F0 via the selection switch SWff0 and is latched thereby. In this way, the latch circuit F/F0 can store therein a logical value of the output OPOUT5. The stored logical value is output from the node Nff0 between the selection switch SWff0 and the latch circuit F/F0. Because operations of other latch circuits F/F1 to F/Fn can be readily understood from the operation of the latch circuit F/F0, explanations thereof will be omitted.

The latch circuits F/F0 to F/Fn are synchronized with the step reference voltage Vref(ST) and latch the output OPOUT5 of the operational amplifier AMP5 each time the step reference voltage Vref(ST) changes. That is, the latch circuits F/F0 to F/Fn latch the output OPOUT5 in time series each time the step reference voltage Vref(ST) changes. Therefore, a time when the logic of the output OPOUT5 has been inverted is known by referring to data latched by the latch circuits F/F0 to F/Fn. Because the step reference voltage Vref(ST) at a time when the logic of the output OPOUT5 has been inverted is equal to the voltage of the node Nsense, the voltage of the node Nsense is known.

The voltage of the node Nsense indicates the write degree of the memory cell MC in FIG. 13. For example, when the memory cell MC is in an intense reset state, the resistance of the memory cell MC is quite high. Therefore, the voltage of the node Nsense keeps a high state. On the other hand, when the reset state of the memory cell MC is weak, the resistance of the memory cell MC is lower than that in the case of the intense reset state. Therefore, the voltage of the node Nsense is relatively low. When the memory cell MC is in an intense set state, the resistance of the memory cell MC is quite low. Therefore, the voltage of the node Nsense is low. On the other hand, when the set state of the memory cell MC is weak, the resistance of the memory cell MC is higher than that in the case of the intense set state. Therefore, the voltage of the node Nsense is relatively high. As described above, the voltage of the node Nsense depends on the write degree even when the each of the logic of data is the same. The latch circuits F/F0 to F/Fn can hold the voltage of the node Nsense corresponding to the write degree as a digital value.

FIG. 15 shows an example of a configuration of a Vsink generator GENsink. The Vsink generator GENsink serving as a voltage generator is a voltage-addition DA converter and includes a transistor Trda, switches SWda0 to SWda(n), resistors R0 to Rn, and operational amplifiers AMP7 and AMPS.

The transistor Trda is connected between the internal power supply VAA and the resistor R0. A gate of the transistor Trda is connected to an output of the operational amplifier AMP8. The transistor Trda allows a constant current to flow to the resistors R0 to Rn or the switches SWda0 to SWda(n) under a control of the operational amplifier AMP8.

The resistors R0 to Rn are connected in series between the transistor Trda and the low voltage source VSS. The switches SWda0 to SWda(n) are connected in parallel to the resistors R0 to Rn, respectively, and are connected in series between the transistor Trda and the low voltage source VSS. Each of the switches SWda0 to SWda(n) is a CMOS switch and gates of the switches SWda0 to SWda(n) receive signals of the nodes Nff0 to Nffn shown in FIG. 14 or inversion signals thereof, respectively. The signals of the nodes Nff0 to Nffn or the inversion signals thereof control the switches SWda0 to SWda(n) to be an on-state or an off-state.

The resistors R0 to Rn function as resistors between the transistor Trda and the low voltage source VSS when the corresponding switches SWda0 to SWda(n) are in the off-state, respectively. For example, when the switch SWda0 is in the off-state, a current flows through the corresponding resistor R0. Therefore, a voltage of a node Nda increases by a voltage applied to the resistor R0.

Meanwhile, the resistors R0 to Rn do not function as resistors and are disabled between the transistor Trda and the low voltage source VSS when the corresponding switches SWda0 to SWda(n) are in the on-state, respectively. For example, when the switch SWda0 is in the on-state, a current hardly flows through the corresponding resistor R0 and flows through the switch SWda0. Therefore, the resistor R0 is disabled between the transistor Trda and the low voltage source VSS. At that time, the voltage of the node Nda decreases by the voltage corresponding to the resistor R0.

In this way, the Vsink generator GENsink controls the switches SWda0 to SWda(n) based on the signals of the nodes Nff0 to Nffn, respectively, and changes the voltage Vsink according to the states of the switches SWda0 to SWda(n). The sink current Isink is thus controlled and the rate of the slow cooling operation can be adjusted.

One input of the operational amplifier AMP7 is connected to the node Nda between the transistor Trda and the resistor R0 and the other input thereof is connected to an output thereof. The output of the operational amplifier AMP7 is connected to the operational amplifier AMP6 in FIG. 13. In this way, the operational amplifier AMP7 outputs the voltage of the node Nda as the voltage Vsink to the operational amplifier AMP6.

The operational amplifier AMP8 controls the transistor Trda to allow a constant current to flow to the transistor Trda.

A write operation of the write driver WD is explained next. It is hereinafter assumed that the reset state is already written to the memory cell MC and that the set state is to be written to the memory cell MC.

First, the current supply path PS supplies a current to the memory cell MC via the bit line BL. The write driver WD performs a read operation to monitor the write degree of data in the memory cell MC before performing the slow cooling operation for write. The read is achieved not by directly detecting the voltage of the bit line BL but by detecting the voltage of the node Nsense using the operational amplifier AMPS. The voltage of the node Nsense can be rapidly detected because the node Nsense is smaller in the capacity than the bit line BL and the state of the memory cell MC can be indicated by a preamplifier function. That is, when the current supply path PS supplies a current to the memory cell MC, the voltage of the node Nsense can be a voltage based on a data state (a resistance) already stored in the memory cell MC.

For example, when the memory cell MC is in an intense reset state, the resistance of the memory cell MC is high. Therefore, the voltage of the node Nsense is relatively high. When the memory cell MC is in a weak reset state, the resistance of the memory cell MC is lower than that in the case of the intense reset state. Therefore, the voltage of the node Nsense is relatively low.

Figure 16:
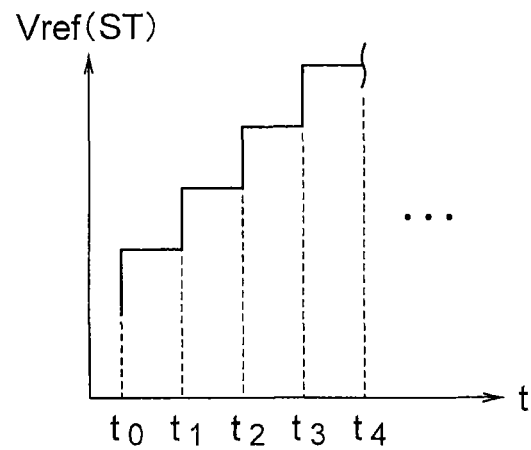
FIG. 16 is a timing chart showing an example of an operation of the step reference voltage Vref(ST)

Meanwhile, the step reference voltage Vref(ST) increases in a stepwise manner at certain time intervals with respect to the voltage of the node Nsense. For example, FIG. 16 is a timing chart showing an example of an operation of the step reference voltage Vref(ST). As shown in FIG. 16, the step reference voltage Vref(ST) increases in a stepwise manner at times t0, t1, t2, t3, t4, . . . . The step reference voltage Vref(ST) changes from a voltage lower than the voltage of the node Nsense to a voltage higher than that of the node Nsense to cross the voltage of the node Nsense.

Each time the step reference voltage Vref(ST) is increased, the register unit REG in FIG. 14 latches the output OPOUT5 of the operational amplifier AMPS in time series. For example, between the times t0 and t1, the latch circuit F/F0 latches the output OPOUT5. Between the times t1 and t2, the latch circuit F/F1 latches the output OPOUT5. Between the times t2 and t3, the latch circuit F/F2 latches the output OPOUT5. Between the times t3 and t4, the latch circuit F/F3 latches the output OPOUT5. The latch circuits F/F4 to F/Fn thereafter similarly latches the output OPOUT5 in time series.

The step reference voltage Vref(ST) is initially lower than the voltage of the node Nsense. Therefore, the output OPOUT5 is logic high. At that time, the relevant latch circuit latches the logic high. When the step reference voltage Vref (ST) increases in steps and exceeds the voltage of the node Nsense, the output OPOUT5 is inverted from the logic high to logic low. At that time, the relevant latch circuit latches the logic low. Therefore, in the latch circuits F/F0 to F/Fn, the logic of latched data is inverted between a certain latch circuit F/Fk and the next latch circuit F/Fk+1 (0≤k≤n). That is, the latch circuits F/F0 to F/Fk latch the logic high and the latch circuits F/Fk+1 to F/Fn latch the logic low.

When the memory cell MC is in an intense reset state, the voltage of the node Nsense is relatively high as described above and thus it takes time for the step reference voltage Vref(ST) to exceed the voltage of the node Nsense. Therefore, the value of k is large. When the memory cell MC is in a weak reset state, the voltage of the node Nsense is relatively low and thus not so much time is required for the step reference voltage Vref(ST) to exceed the voltage of the node Nsense. Therefore, the value of k is small.

In this way, the register unit REG holds therein information corresponding to the write degree of existing data stored in the memory cell MC.

Next, the Vsink generator GENsink shown in FIG. 15 determines the voltage Vsink based on the information latched in the register unit REG. For example, when the latch circuits F/F0 to F/Fk latch logic high, the switches SWda0 to SWdak are in the on-state. Accordingly, a current flows in the switches SWda0 to SWdak and hardly flows in the resistors R0 to Rk connected in parallel to the switches SWda0 to SWdak, respectively. Meanwhile, because the latch circuits F/Fk+1 to F/Fn latch logic low in this case, the switches SWdak+1 to SWda(n) are in the off-state. Therefore, the current flows in the resistors Rk+1 to Rn corresponding to the switches SWdak+1 to SWda(n), respectively. In this way, the voltage Vsink is determined.

For example, when the memory cell MC is in an intense reset state and the value of k is large, the number of resistors connected effectively between the internal power supply VAA and the low voltage source VSS is small and the voltage Vsink is relatively low. On the other hand, when the memory cell MC is in a weak reset state and the value of k is small, the number of resistors connected effectively between the internal power supply VAA and the low voltage source VSS is large and the voltage Vsink is relatively high.

When the voltage Vsink is determined, the sink current Isink in the slow cooling operation is determined, which determines the decrease rate of the voltage of the bit line BL. For example, when the memory cell MC is in an intense reset state and the value of k is large, the voltage Vsink is relatively low as described above. When the voltage Vsink is low, the transistor Tsink3 in FIG. 13 causes the sink current Isink to be relatively small and thus the slow cooling operation becomes slower. On the other hand, when the memory cell MC is in a weak reset state and the value of k is small, the voltage Vsink is relatively high as described above. When the voltage Vsink is high, the transistor Tsink3 in FIG. 13 causes the sink current Isink to be relatively large and thus the slow cooling operation becomes relatively rapid.

In this way, when the memory cell MC is in an intense reset state, the slow cooling operation is performed slowly to reliably write the set state to the memory cell MC. On the other hand, when the memory cell MC is in a weak reset state, the set state is reliably written to the memory cell MC even if the slow cooling operation is performed relatively rapidly.

The write operation described above is also applicable to a case where the reset state is to be written to the memory cell MC in the set state. However, when the memory cell MC is in an intense set state, the resistance of the memory cell MC is low. When the memory cell MC is in a weak set state, the resistance of the memory cell MC is higher than that in the case of the intense set state. Therefore, when the step reference voltage Vref(ST) is increased from a voltage lower than the voltage of the node Nsense, the logic of the output OPOUT5 of the operational amplifier AMP5 is inverted at an earlier time between t0 and to as the set state has been written more intensely. That is, the value of k described above is smaller. Therefore, it suffices to set the logic of the output OPOUT5 of the operational amplifier AMP5 to be opposite to that in the case of rewriting from the reset state to the set state. Alternatively, the logic of the signals of the nodes Nff0 to Nffn or the inversion signals thereof to be input to the switches SWda0 to SWda(n) of the Vsink generator GENsink can be set opposite.

Further alternatively, the step reference voltage Vref(ST) can be decreased from a voltage higher than the voltage of the node Nsense to a lower voltage. Accordingly, also when the reset state is to be written to the memory cell MC in the set state, the write driver WD can monitor the write degree of the existing set state having been written to the memory cell MC and adjust the slow cooling operation at the time of write of the reset state according to the write degree.

As described above, in the fifth embodiment, the write degree of existing data having been written to the memory cell MC is monitored and the sink circuit SNK is controlled based on the write degree of the data. The sink circuit SNK thus can set the decrease rate of the voltage of the bit line BL to be lower when the write degree of data is relatively high and set the decrease rate of the voltage of the bit line BL to be higher when the write degree of data is relatively low. As a result, the slow cooling operation at the time of write of new data can be adjusted according to the write degree of data. Consequently, in the slow cooling operation, an excess sink current Isink can be suppressed while data is reliably written.

Sixth Embodiment

Figure 17:
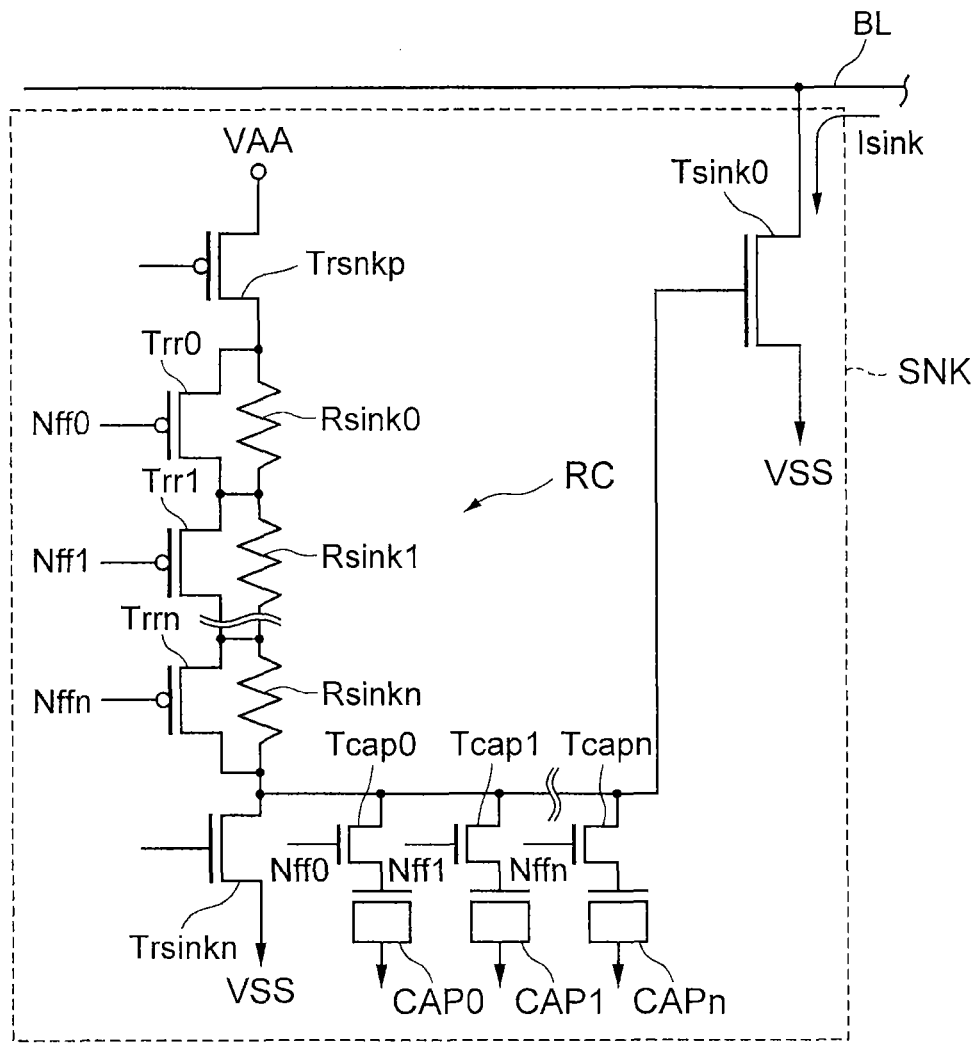
FIG. 17 shows an example of a configuration of the sink circuit SNK according to a sixth embodiment.

FIG. 17 shows an example of a configuration of the sink circuit SNK according to a sixth embodiment. A memory according to the sixth embodiment includes the sink circuit SNK shown in FIG. 17 instead of the Vsink generator GENsink according to the fifth embodiment. The sink circuit SNK has fundamentally the same configuration as that of the sink circuit SNK according to the second embodiment. Other configurations of the memory according to the sixth embodiment can be identical to the corresponding configurations of the memory according to the fifth embodiment. That is, the sixth embodiment can be regarded as a combination of the second and fifth embodiment.

The sink circuit SNK has fundamentally the same configuration as that of the sink circuit SNK shown in FIG. 6. Therefore, the sink circuit SNK includes the RC delay circuit RC. However, in the RC delay circuit RC in FIG. 17, the numbers of resistors and capacitors are n+1 (n is an integer), respectively, to conform to the number of the latch circuits in FIG. 14. The numbers of transistors corresponding to the resistors and the capacitors are also n+1, respectively. That is, the RC delay circuit RC includes resistors Rsink0 to Rsinkn, capacitors CAP0 to CAPn, transistors Trr0 to Trrn, and transistors Tcap0 to Tcapn. The transistors Trr0 to Trrn are P-type transistors and have gates connected to the nodes Nff0 to Nffn of the register unit REG in FIG. 14, respectively. Gates of the transistors Tcap0 to Tcapn are also connected to the nodes Nff0 to Nffn of the register unit REG in FIG. 14, respectively.

A write operation of the write driver WD according to the sixth embodiment is explained here. It is assumed that the reset state is already written to a memory cell MC and the set state is to be written to the memory cell MC. Although not shown in FIG. 17, operations of the operational amplifier AMP5 (FIG. 13) and the register unit REG (FIG. 14) can be identical to the operations of those in the fifth embodiment.

The sink circuit SNK shown in FIG. 17 controls a reaction rate of the transistor Tsink0 based on the information latched in the register unit REG. For example, when the latch circuits F/F0 to F/Fk (0≤k≤n) shown in FIG. 14 latch logic high, the transistors Trr0 to Trrk are in the off-state and the transistors Tcap0 to Tcapk are in the on-state. Accordingly, the resistors Rsink0 to Rsinkk and the capacitors CAP0 to CAPk constitute the RC delay circuit RC. Meanwhile, the transistors Trrk+1 to Trrn are in the on-state and the transistors Tcapk+1 to Tcapn are in the off-state. The resistors Rsinkk+1 to Rsinkn and the capacitors CAPk+1 to CAPn thus do not constitute the RC delay circuit RC.

Accordingly, the RC delay circuit RC constituted by the resistors Rsink0 to Rsinkk and the capacitors CAP0 to CAPk delays the voltage from the internal power supply VAA and transmits the delayed voltage to the transistor Tsink0.

In this case, when the memory cell MC is in an intense reset state and the value of k is large, the numbers of resistors and capacitors constituting the RC delay circuit RC are large. Therefore, the time constant of the RC delay circuit RC becomes large and the reaction rate of the transistor Tsink0 becomes low. Accordingly, the slow cooling operation becomes slow.

Meanwhile, when the memory cell MC is in a weak reset state and the value of k is small, the numbers of resistors and capacitors constituting the RC delay circuit RC are small. Therefore, the time constant of the RC delay circuit RC becomes small and the reaction rate of the transistor Tsink0 becomes high. Accordingly, the slow cooling operation becomes relatively rapid.

In this way, the sink circuit SNK can adjust the rate of the voltage sink of the bit line BL in the write operation similarly to the sink circuit SNK according to the second embodiment.

Other operations in the sixth embodiment can be identical to the corresponding operations in the fifth embodiment. Furthermore, as described above, the write operation according to the sixth embodiment is also applicable to a case where the reset state is to be written to a memory cell MC in the set state. Accordingly, the sixth embodiment can achieve effects identical to those of the fifth embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a plurality of resistance-change storage elements;
a plurality of bit lines connected to the storage elements, respectively; and
a voltage control circuit controlling a decreasing rate of an absolute value of a voltage of a selected bit line among the bit lines when data is written to one of the storage elements, wherein
the voltage control circuit comprises:
a plurality of current supply paths supplying a current to the selected bit line when data is written to one of the storage elements; and
a plurality of current control switches between the current supply paths corresponding thereto, respectively, and the selected bit line, wherein
the current supply paths are disconnected from the selected bit line by the current control switches, respectively, in time series when an absolute value of a voltage of the selected bit line is to be decreased after being increased in a data write operation.

2. The device of claim 1, wherein the voltage control circuit comprises a current mirror circuit controlling a current pulled out of one of the bit lines.

3. The device of claim 1, wherein the voltage control circuit comprises a delay circuit controlling a current pulled out of one of the bit lines.

4. The device of claim 1, wherein
respective current drive capabilities of the current supply paths are substantially equal, and
the current supply paths are disconnected from the selected bit line at substantially equal intervals in time series when an absolute value of a voltage of the selected bit line is to be decreased after increased in a data write operation.

5. The device of claim 1, wherein
respective current drive capabilities of the current supply paths are different, and
the current supply paths are disconnected from the selected bit line at substantially equal intervals in time series in a descending order of the current drive capabilities or are disconnected from the selected bit line at substantially equal intervals in time series in an ascending order of the current drive capabilities when an absolute value of a voltage of the selected bit line is to be decreased after increased in a data write operation.

6. The device of claim 1, wherein
respective drive capabilities of the current supply paths are different, and
the current supply paths are disconnected from the selected bit line in such an order that the current drive capabilities are small, large, and small in time series when an absolute value of a voltage of the selected bit line is to be decreased after increased in a data write operation.

7. The device of claim 1, wherein
respective current drive capabilities of the current supply paths are different, and
the current supply paths are disconnected from the selected bit line in such an order that the current drive capabilities are large, small, and large in time series when an absolute value of a voltage of the selected bit line is to be decreased after increased in a data write operation.

8. The device of claim 1, further comprising a first control unit controlling the voltage control circuit to stop an operation to decrease an absolute value of a voltage of the selected bit line when completion of data write to the storage element is detected in a data write operation.

9. The device of claim 8, further comprising a current supply path supplying a current to the selected bit line when data is to be written to the storage element, wherein
the first control unit detects completion of data write to the storage element based on a voltage of the current supply path, and
the voltage control circuit comprises a stop transistor stopping a flow of a current from the selected bit line when the first control unit detects completion of data write.

10. The device of claim 8, further comprising a delay circuit located between the first control unit and the voltage control circuit and delaying an output signal from the first control unit to the voltage control circuit.

11. The device of claim 8, further comprising:
a current supply path supplying a current to the selected bit line when data is to be written to the storage element, wherein
the second control unit detects the write degree of the data by comparing a voltage of the current supply path and a reference voltage changing to cross the voltage of the current supply path with each other.

12. The device of claim 8, wherein
the voltage control circuit comprises:

a first sink transistor allowing a first sink current to flow from the selected bit line when data is to be written to the storage element;

a second sink transistor allowing a second sink current to flow from the selected bit line when data is to be written to the storage element; and a stop transistor stopping a flow of a current from the selected bit line when the first control unit detects completion of data write.

13. The device of claim 12, wherein the voltage control circuit performs an operation of the first sink transistor to allow the first sink current to flow from the selected bit line and an operation of the second sink transistor to allow the second sink current to flow from the selected bit line when data is to be written to the storage element.

14. The device of claim 1, further comprising a second control unit detecting a write degree of data having been already stored in the storage element and controlling the voltage control circuit based on the write degree of the data when an absolute value of a voltage of the selected bit line is to be decreased after increased in a data write operation.

15. The device of claim 14, wherein the second control unit reduces a decrease rate of a voltage of the selected bit line when the write degree of the data is relatively high, and increases a decrease rate of an absolute value of a voltage of the selected bit line when the write degree of the data is relatively low.

16. The device of claim 15, further comprising:

a register unit connected to an output of the second control unit and holding information corresponding to the write degree of the data; and a voltage generator connected to an output of the register unit and outputting a voltage corresponding to the write degree of the data to the voltage control unit.

17. The device of claim 14, further comprising:

a register unit connected to an output of the second control unit and holding information corresponding to the write degree of the data; and a voltage generator connected to an output of the register unit and outputting a voltage corresponding to the write degree of the data to the voltage control unit.

18. The device of claim 14, further comprising:

a register unit connected to an output of the second control unit and holding information corresponding to the write degree of the data; and a delay circuit connected to an output of the register unit and controlling the voltage control circuit operating at a delay time corresponding to the write degree of the data.

19. The device of claim 1, wherein the storage elements are PCMs or iPCMs, respectively.

* * * * *